United States Patent
Yoshida et al.

(10) Patent No.: US 7,884,428 B2
(45) Date of Patent: Feb. 8, 2011

(54) SEMICONDUCTOR DEVICE AND METHOD FOR MANUFACTURING THE SAME

(75) Inventors: Yoichi Yoshida, Osaka (JP); Kenshi Kanegae, Osaka (JP)

(73) Assignee: Panasonic Corporation, Osaka (JP)

( * ) Notice: Subject to any disclaimer, the term of this patent is extended or adjusted under 35 U.S.C. 154(b) by 302 days.

(21) Appl. No.: 12/062,072

(22) Filed: Apr. 3, 2008

(65) Prior Publication Data

US 2008/0246102 A1    Oct. 9, 2008

(30) Foreign Application Priority Data

Apr. 6, 2007    (JP) .............................. 2007-100477

(51) Int. Cl.
    *H01L 29/78*    (2006.01)
(52) U.S. Cl. ............... 257/412; 257/413; 257/E29.555; 257/E21.409; 438/592; 438/656; 438/683
(58) Field of Classification Search ................. 438/592, 438/656, 683; 257/412, 413, E29.255, E21.409
    See application file for complete search history.

(56) References Cited

U.S. PATENT DOCUMENTS 6,977,194 B2 *   12/2005   Belyansky et al. .......... 438/197

2006/0081942 A1 *   4/2006   Saito .......................... 257/388
2009/0115002 A1 *   5/2009   Tatsumi et al. .............. 257/412

FOREIGN PATENT DOCUMENTS

| JP | 2006-261282 | 9/2006 |
|---|---|---|
| JP | 2007-49166 | 2/2007 |

OTHER PUBLICATIONS

Lauwers, A., et al., "CMOS Integration of Dual Work Function Phase Controlled Ni FUSI with Simultaneous Silicidation of NMOS (NiSi) and PMOS (Ni-rich silicide) Gates on HfSiON", IEDM Tech. Dig., 2005, vol. 27 No. 4.

Kittl, J.A., et al., "CMOS Integration of Dual Work Function Phase-Controlled Ni Fully Silicided Gates (NMOS: NiSi, PMOS: $Ni_2Si$, and $Ni_{31}Si_{12}$) on HfSiON", IEEE Electron Device Letters, Dec. 2006, pp. 966-968, vol. 27 No. 12, IEEE.

* cited by examiner

*Primary Examiner*—Trung Dang
(74) *Attorney, Agent, or Firm*—McDermott Will & Emery LLP

(57) ABSTRACT

A semiconductor device includes an Nch transistor having a first gate electrode and a Pch transistor having a second gate electrode. The first gate electrode and the second gate electrode are made of materials causing stresses of different magnitudes.

28 Claims, 32 Drawing Sheets

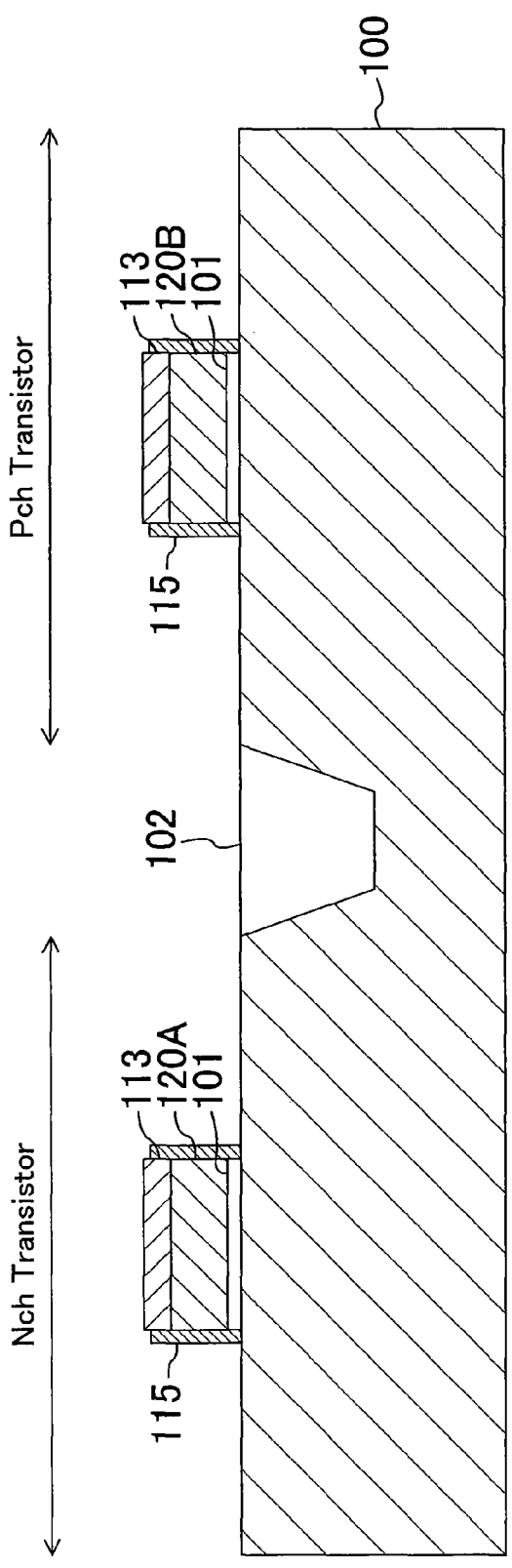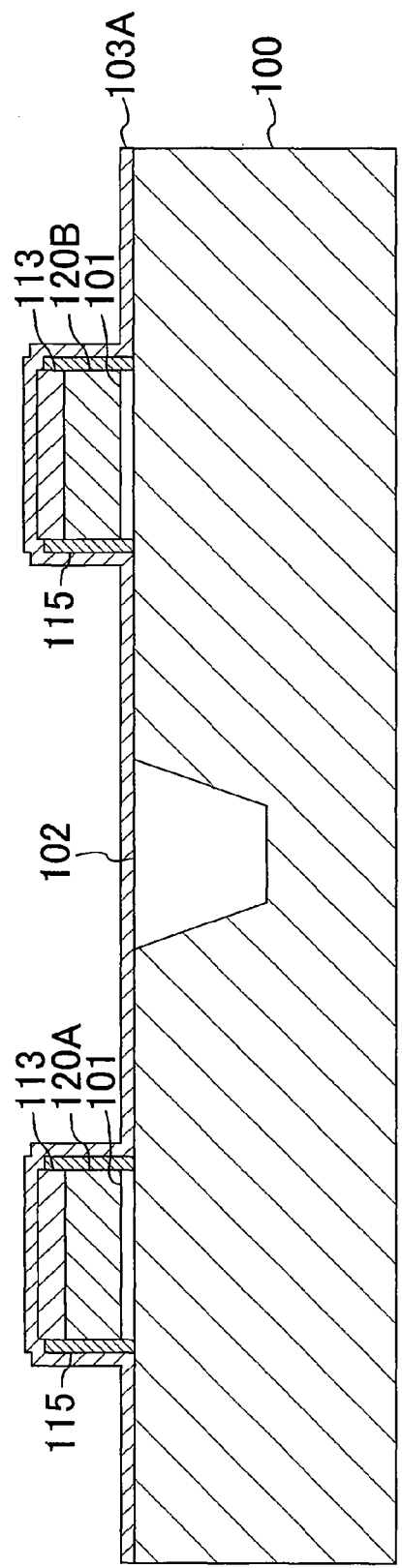

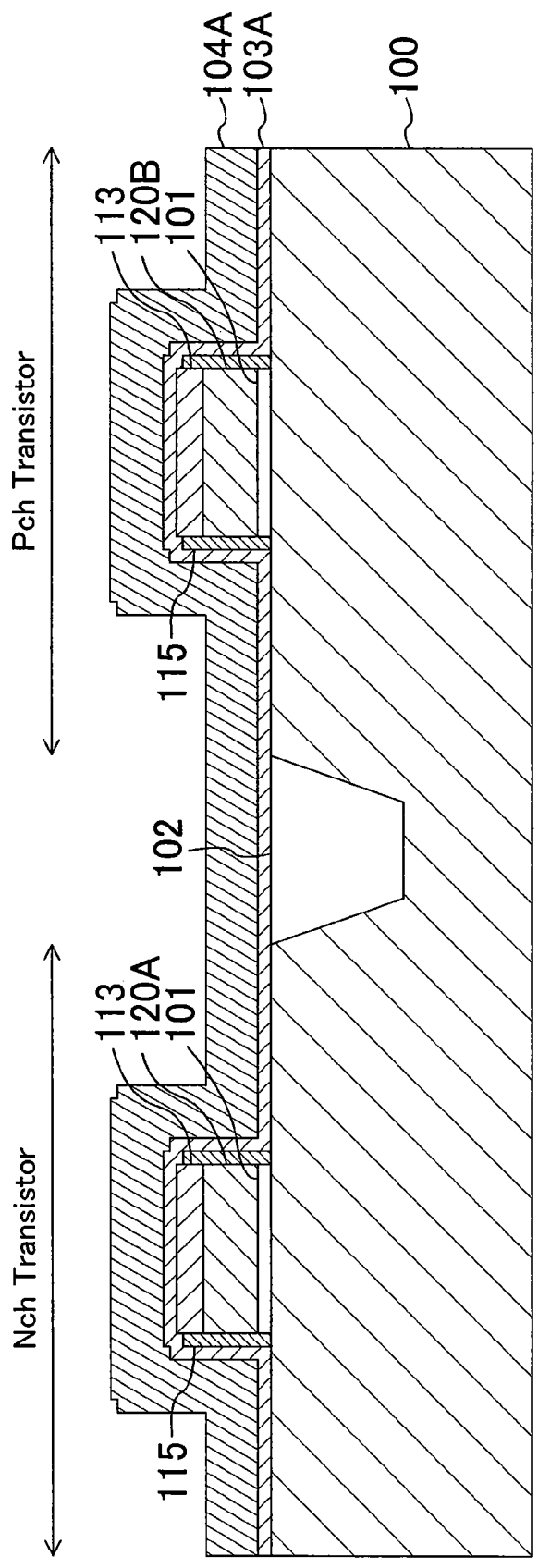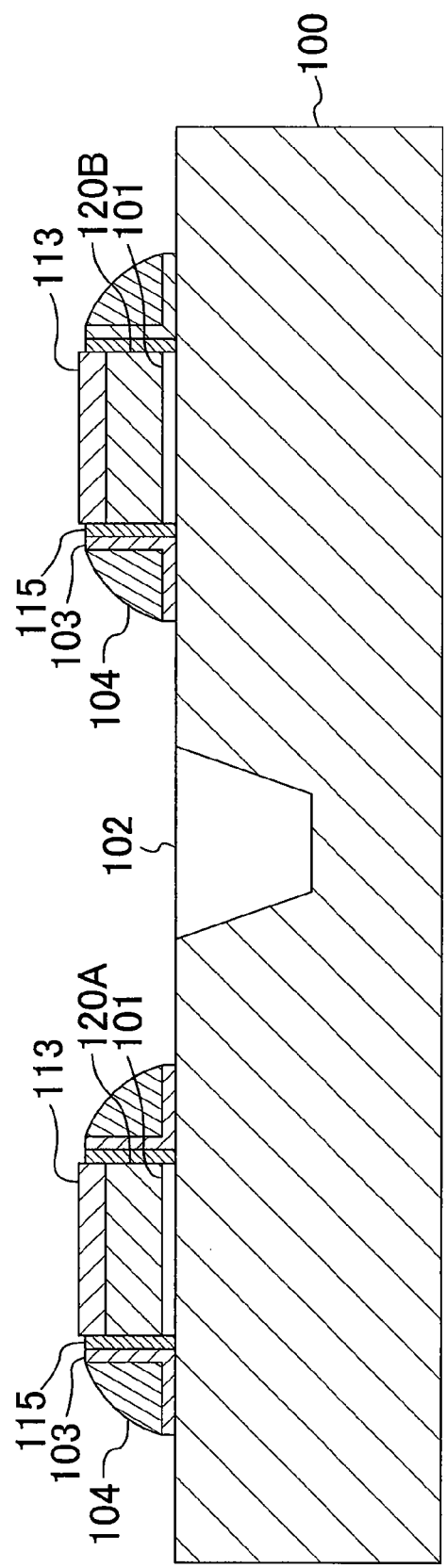

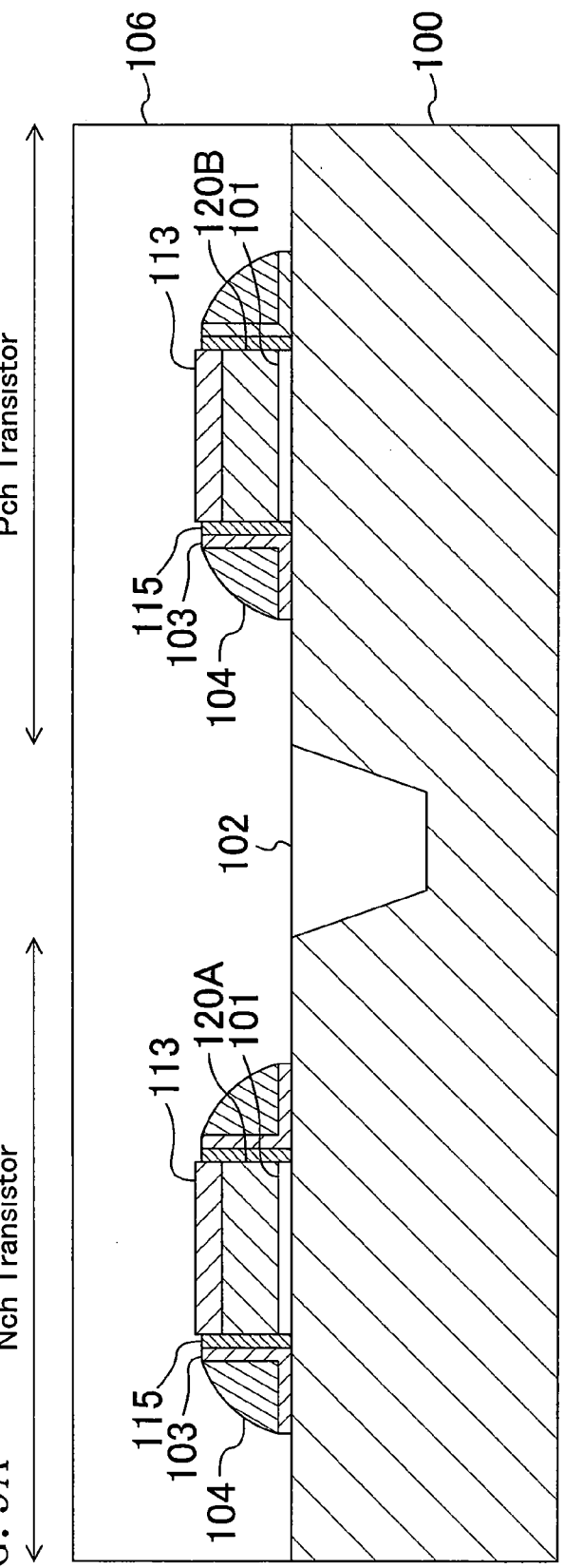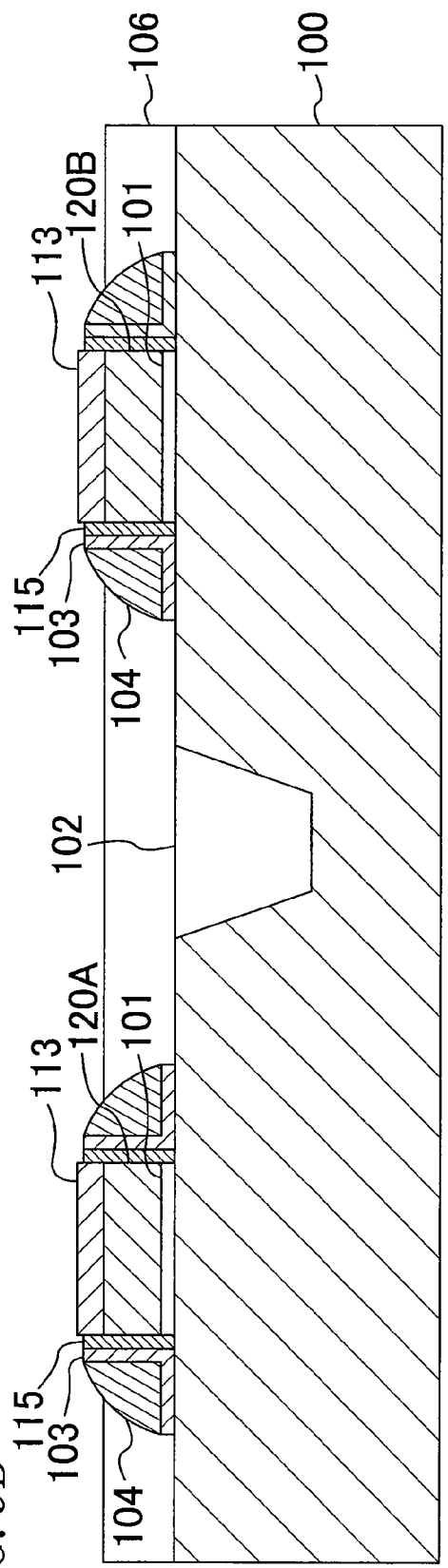

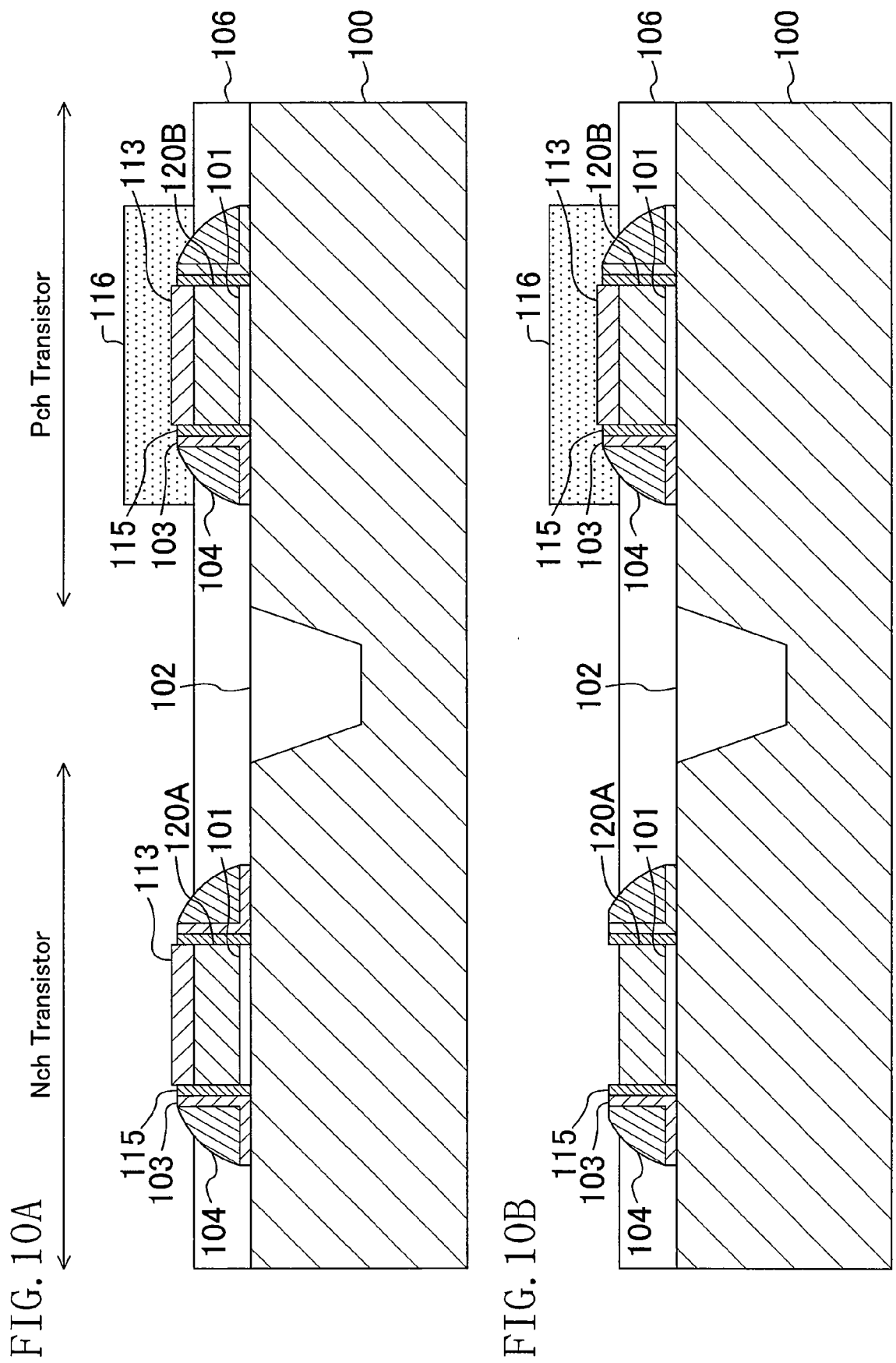

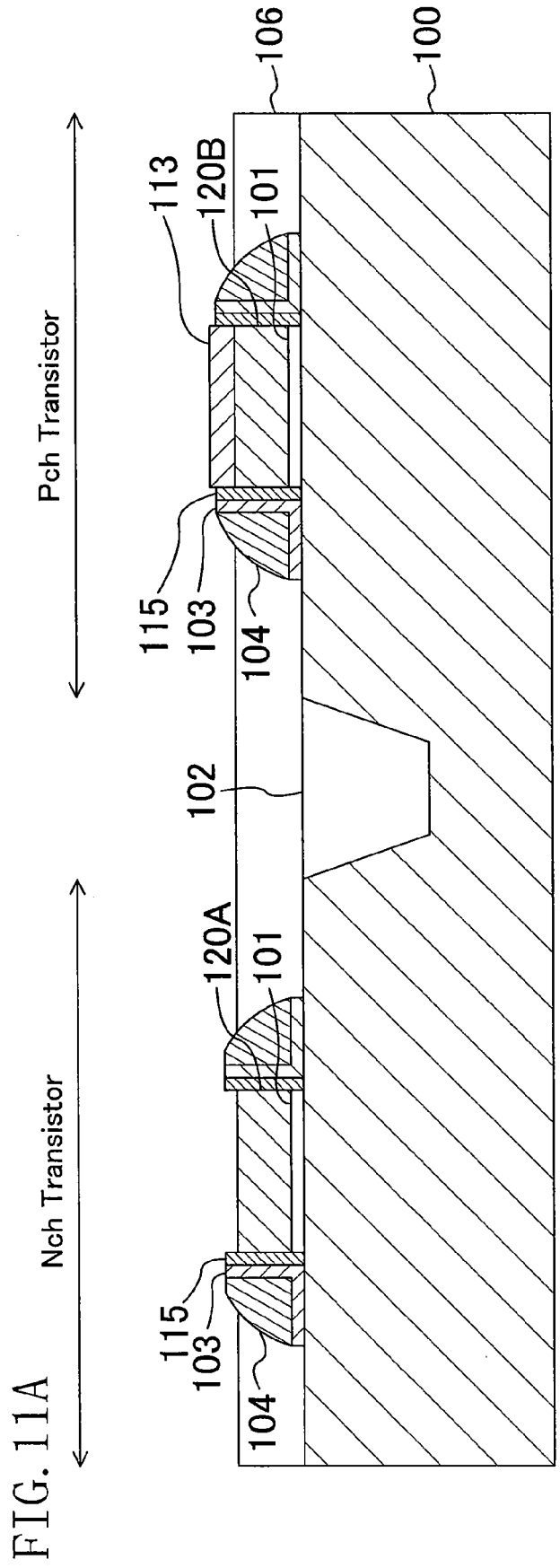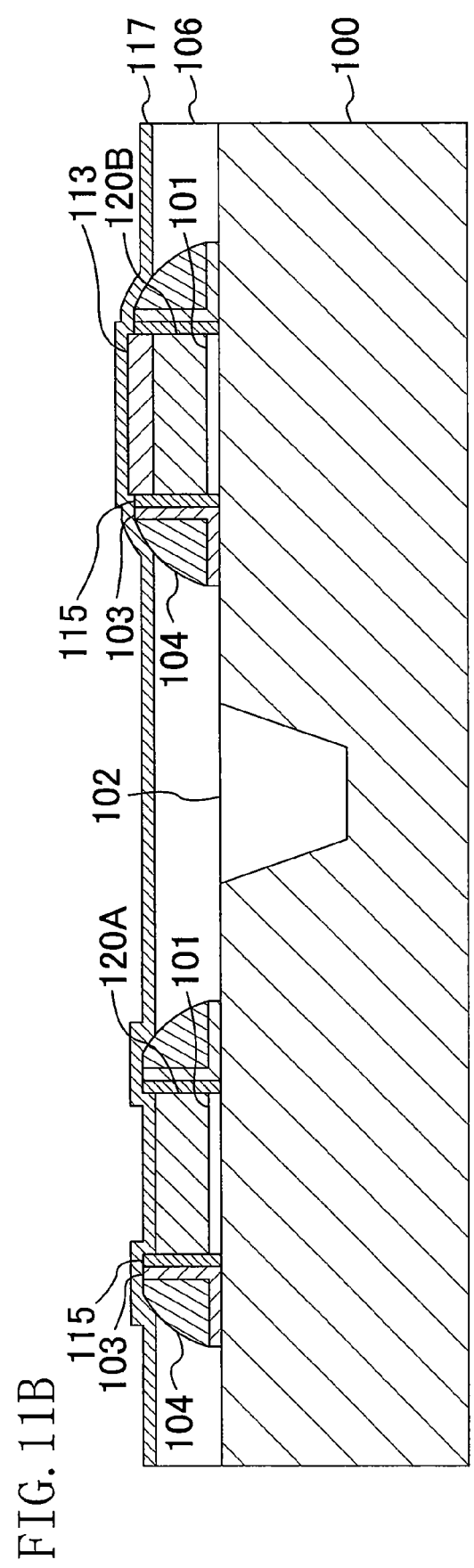

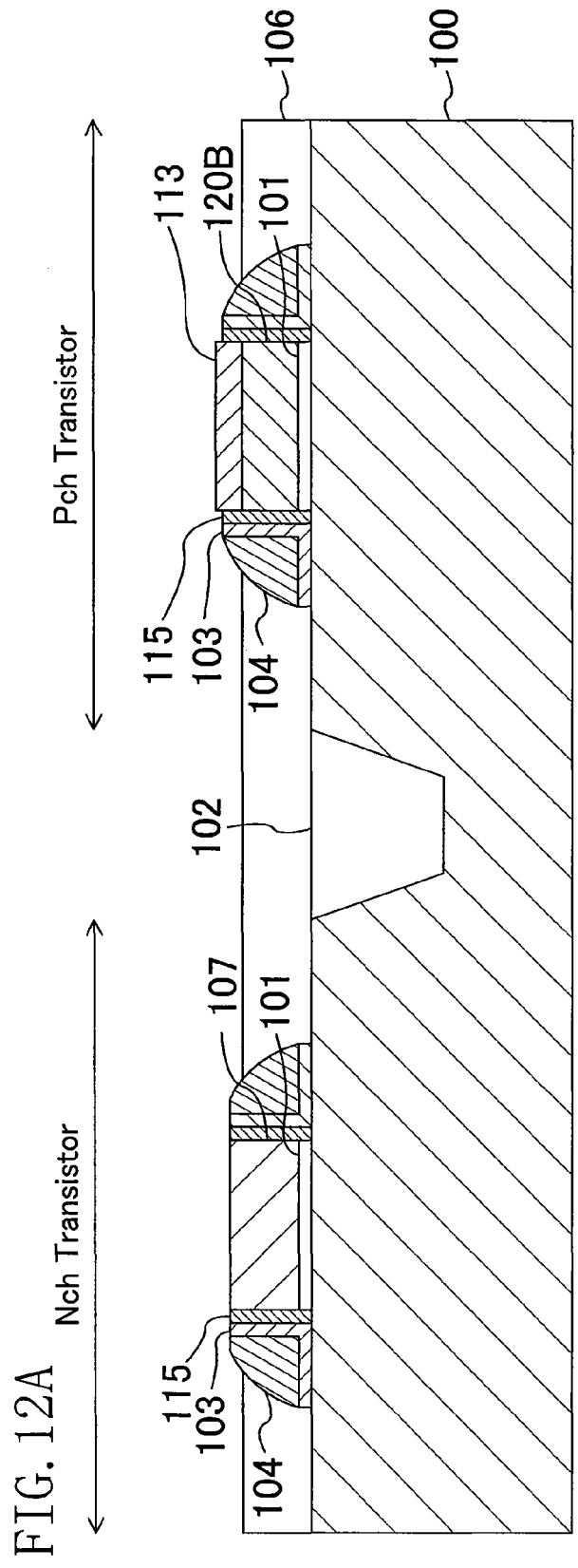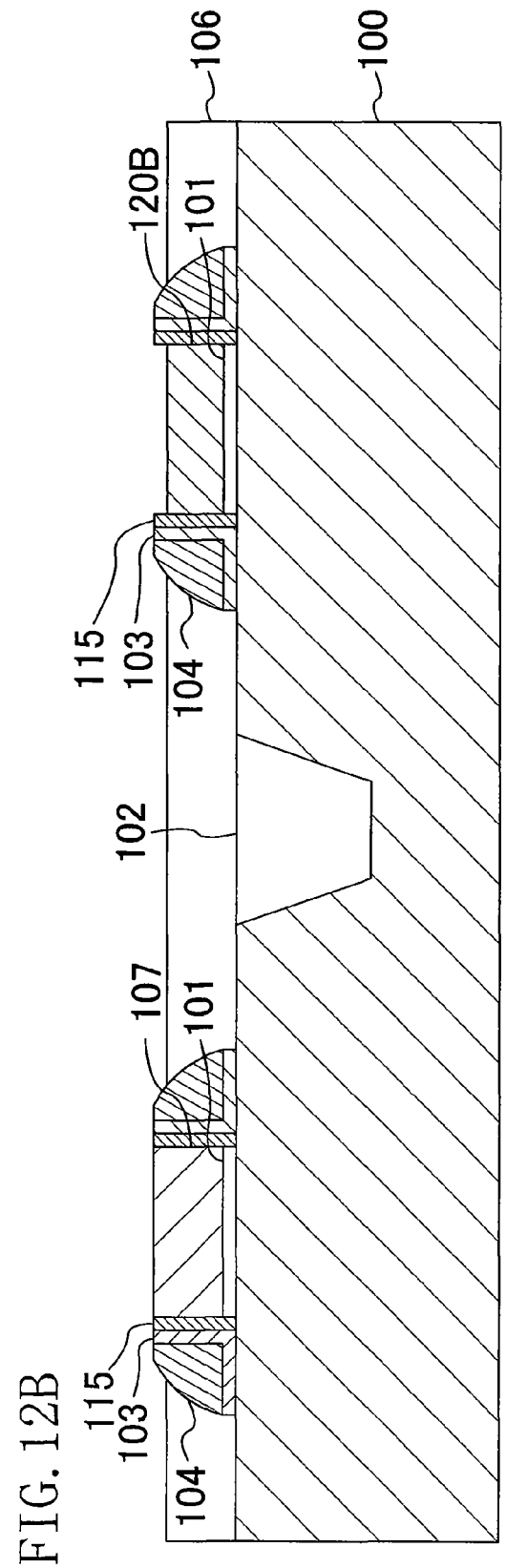

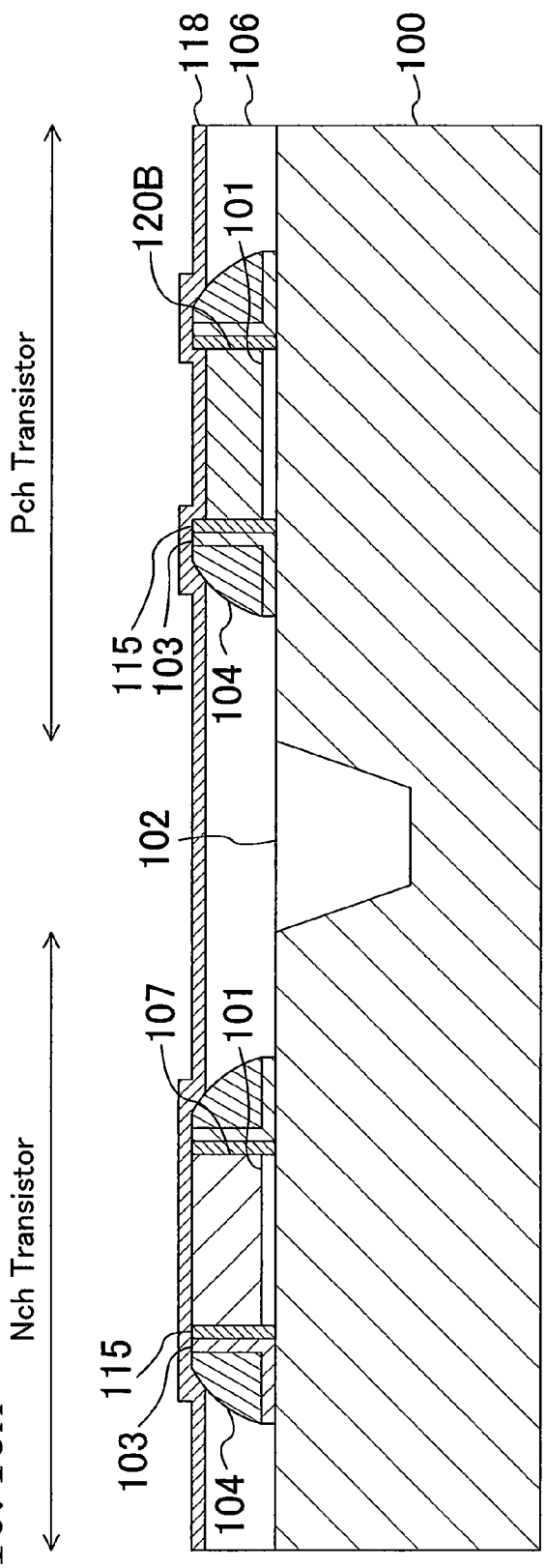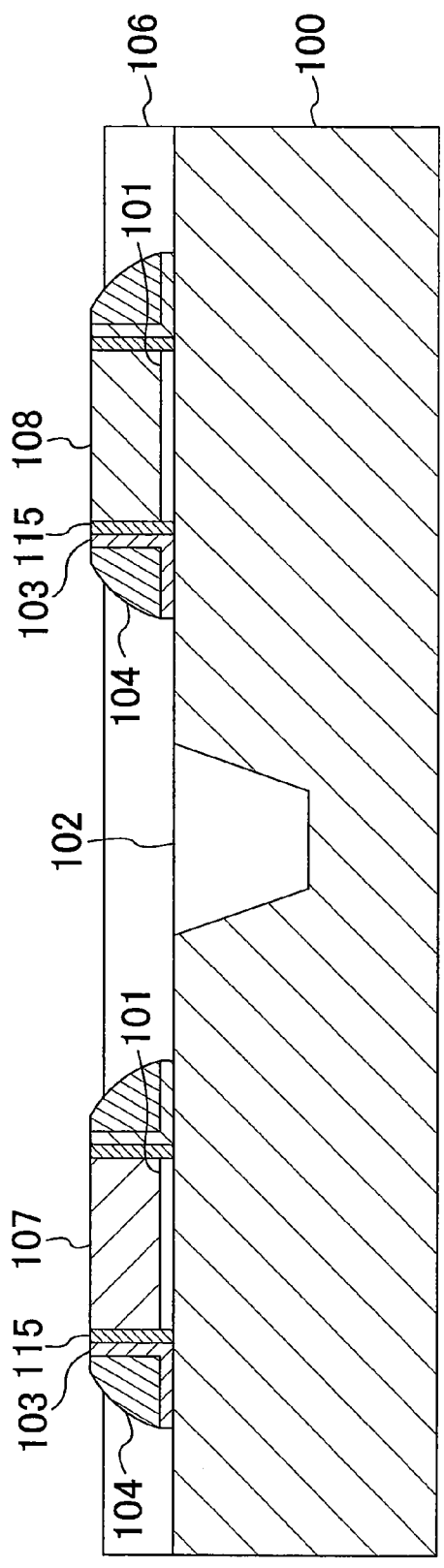

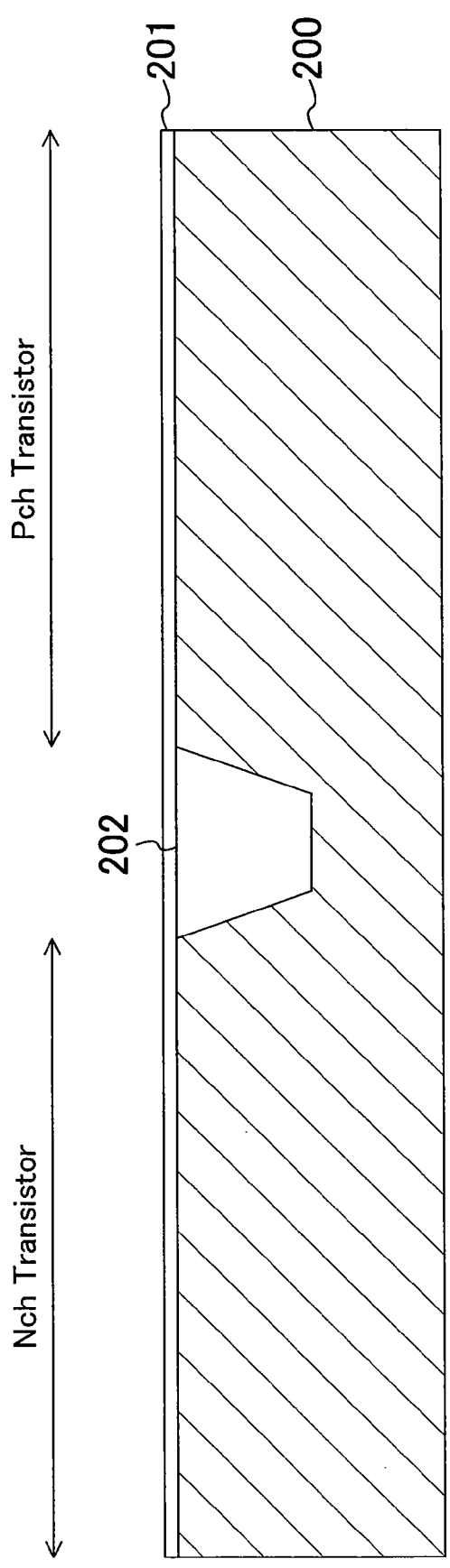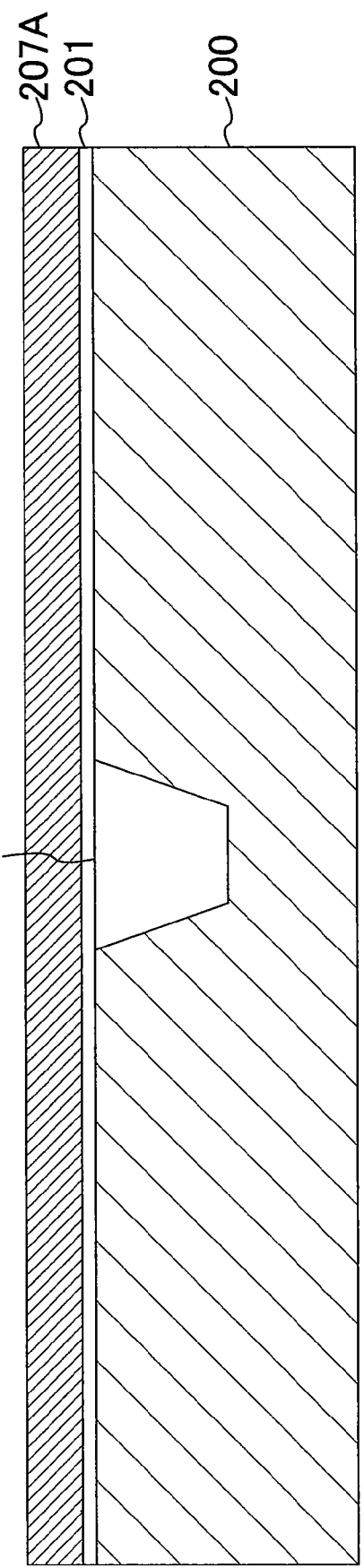

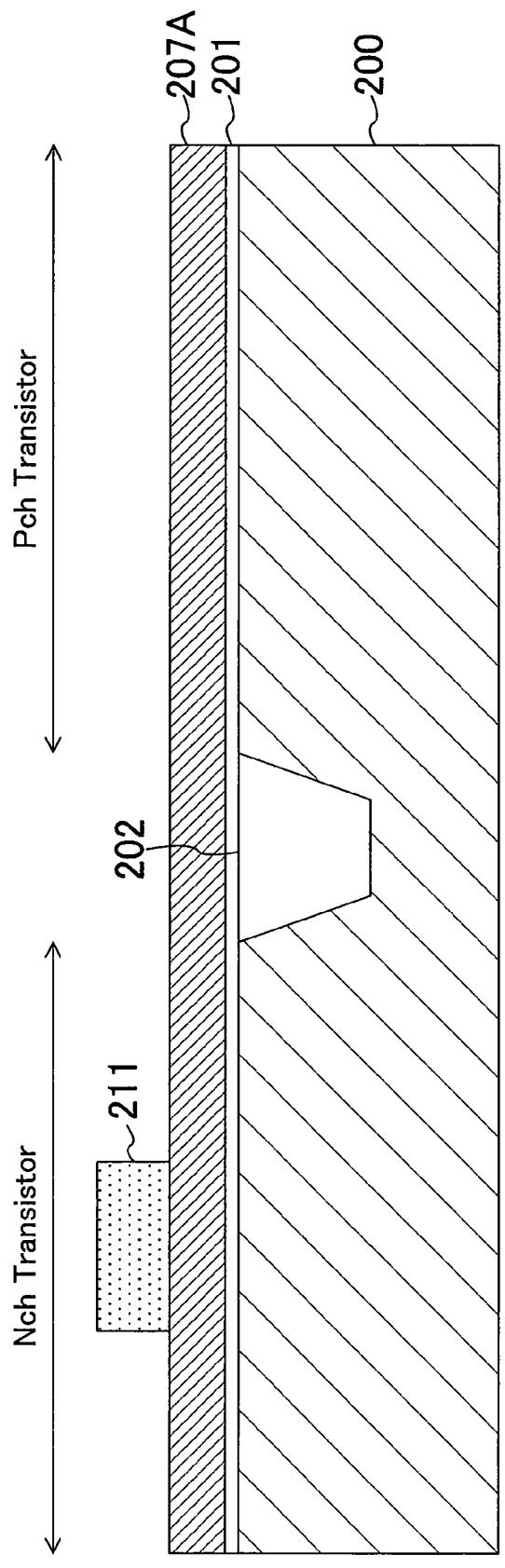
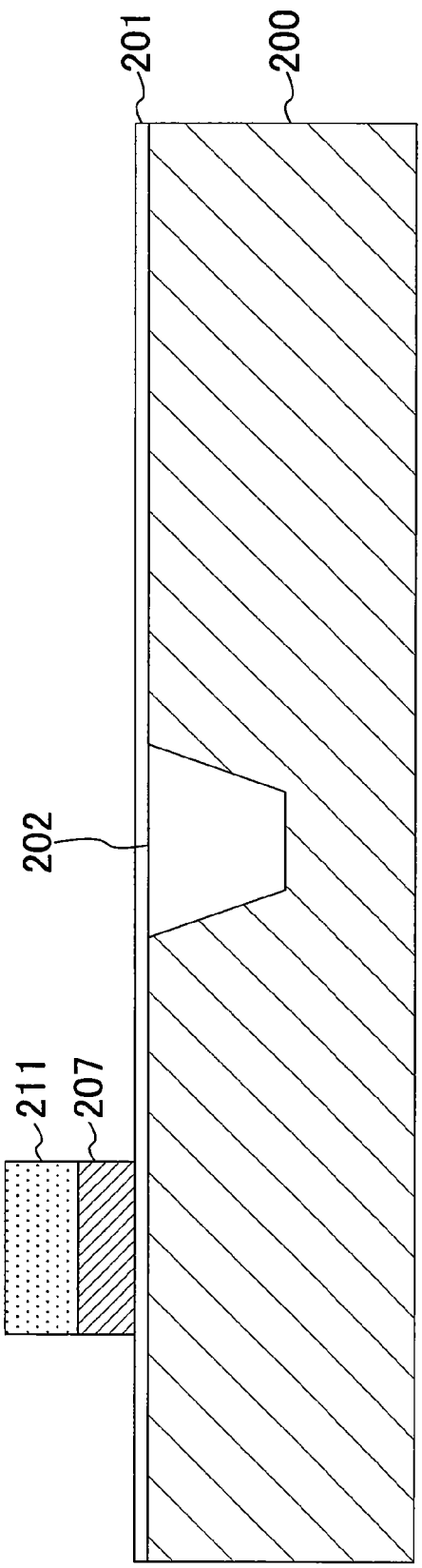
FIG. 18A
FIG. 18B

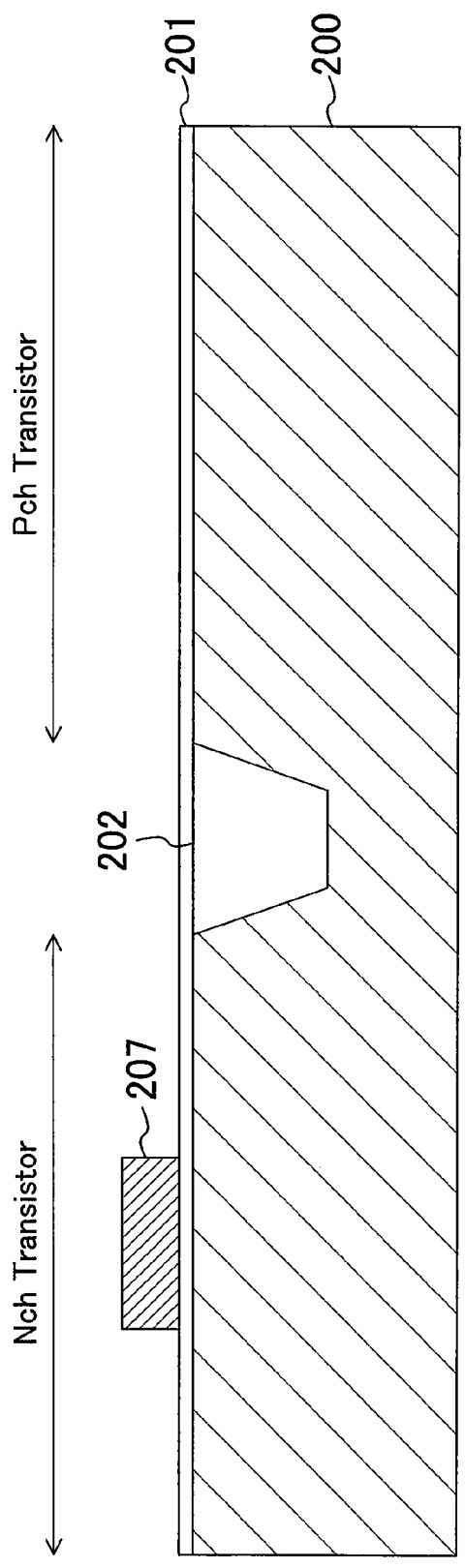
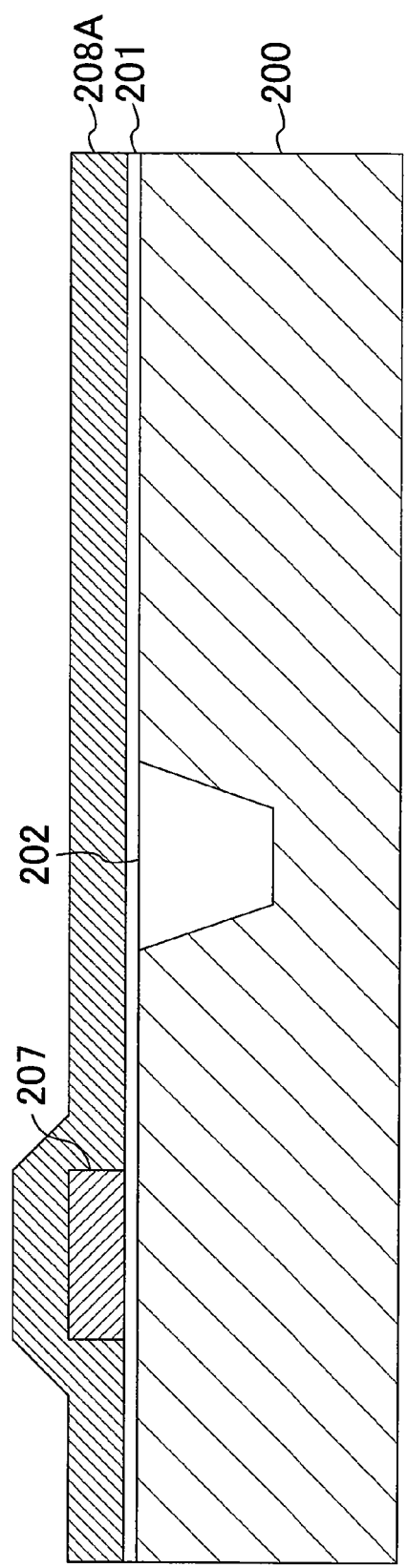

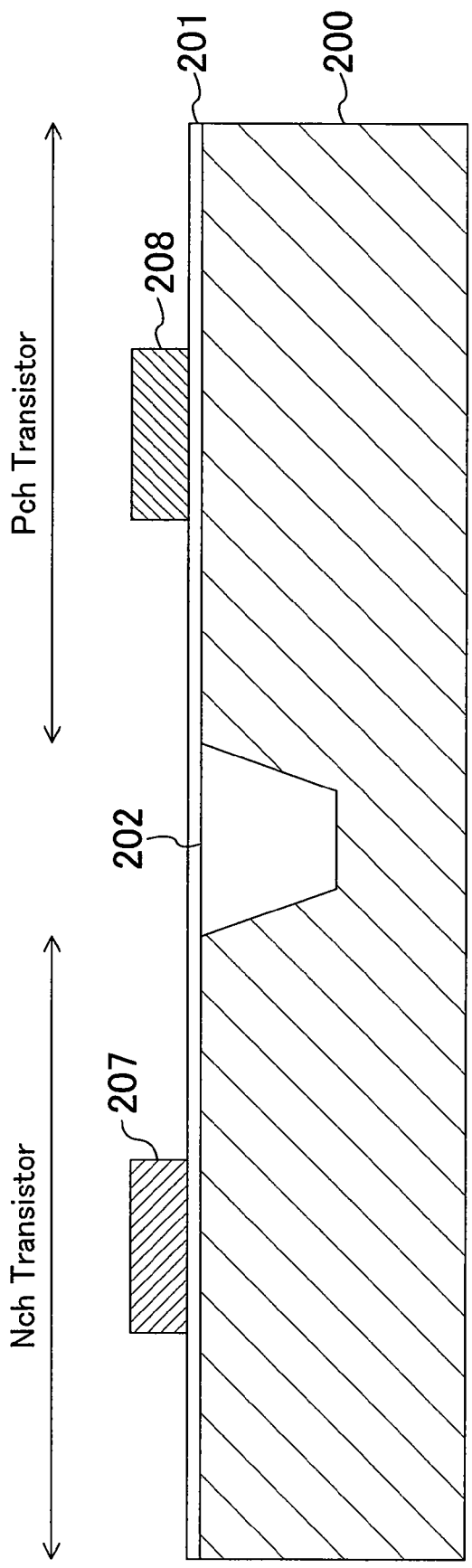
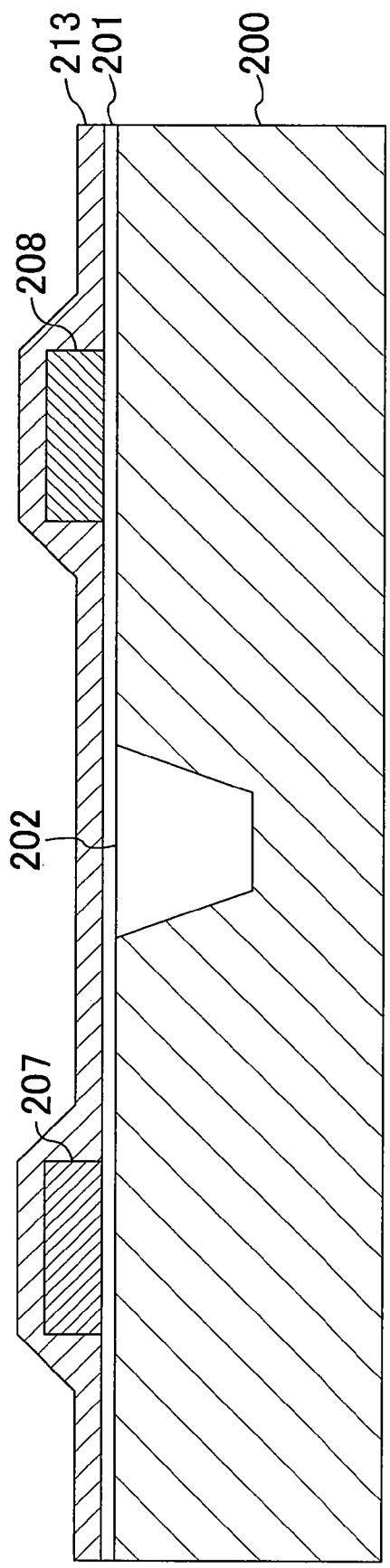

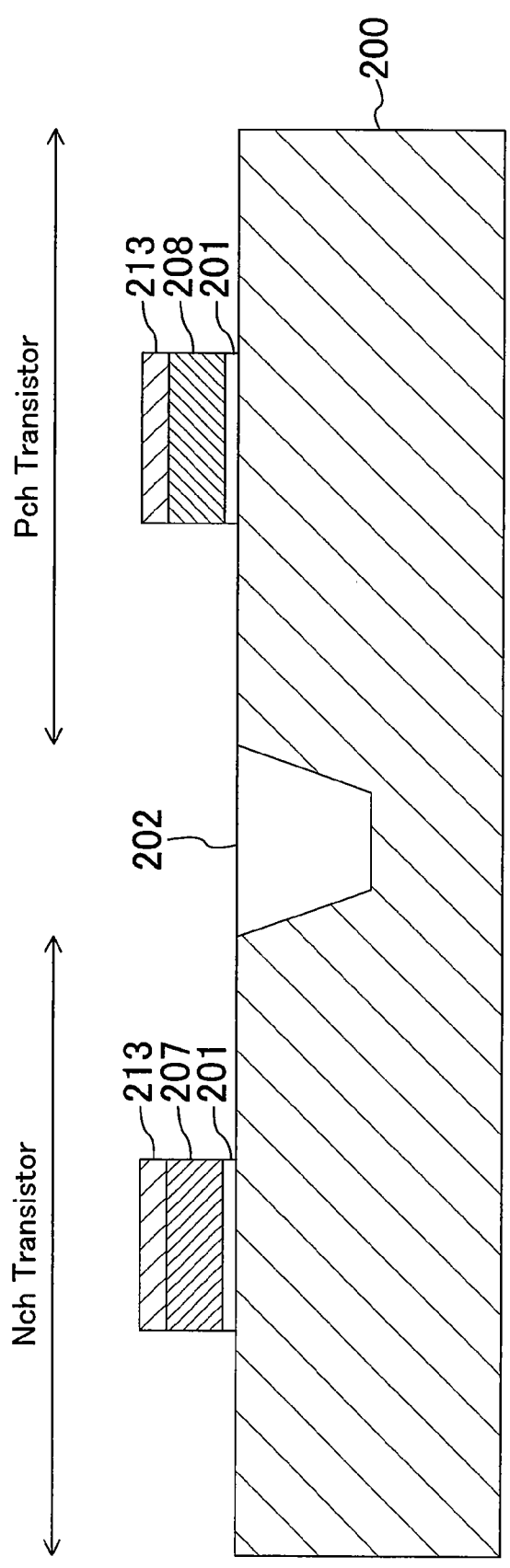

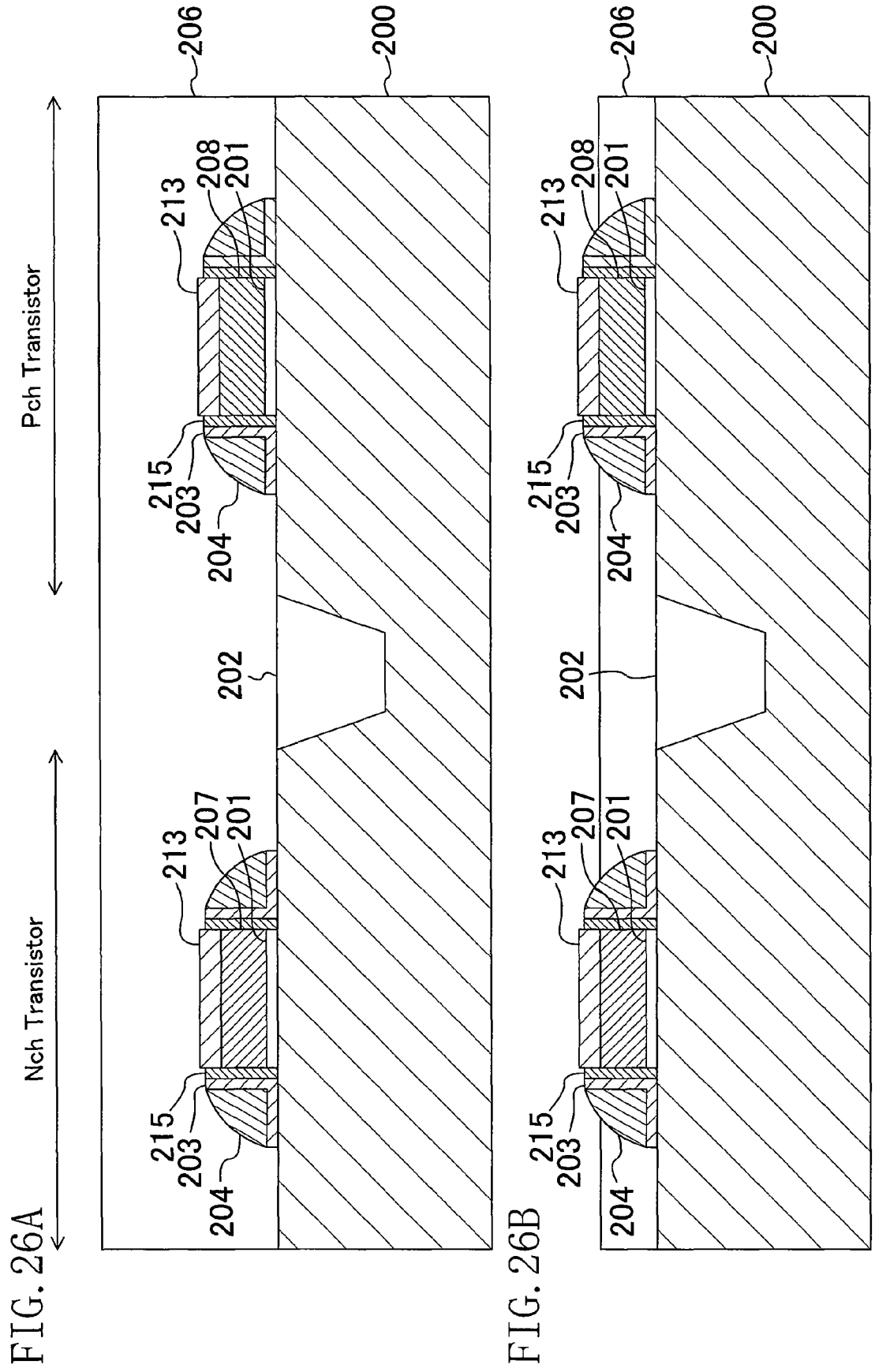

FIG. 30

|   | Si-based Compounds | Density (g/cm³) | Ge-based Compounds | Density (g/cm³) |
|---|---|---|---|---|
| Ti | TiSi | 4.32 | $Ti_6Ge_5$ | 6.14 |
|   | $TiSi_2$ | 4.07 |   |   |
|   | $Ti_5Si_3$ | 4.36 |   |   |
| Zr | $ZiSi_2$ | 4.86 | $ZrGe_2$ | 7.36 |
|   | $Zr_2Si$ | 6.04 |   |   |
|   | $Zr_5Si_3$ | 6.00 |   |   |
|   | $Zr_5Si_4$ | 5.72 |   |   |
| V | $VSi_2$ | 4.66 | $V_3Ge$ | 6.84 |
|   | $V_3Si$ | 5.69 | $V_{17}Ge_{31}$ | 7.08 |
|   | $V_6Si_5$ | 5.09 |   |   |
| Ta | $TaSi_2$ | 9.14 | $TaGe_2$ | 11.43 |
|   | $Ta_2Si$ | 13.50 | $Ta_3Ge$ | 14.83 |
|   | $Ta_{3.28}Si_{0.72}$ | 12.84 | $Ta_5Ge_3$ | 14.26 |
|   | $Ta_3Si$ | 14.11 |   |   |
|   | $Ta_5Si_3$ | 13.03 |   |   |
| Cr | CrSi | 5.39 | CrGe | 7.48 |
|   | $CrSi_2$ | 5.01 | $Cr_3Ge$ | 7.64 |
|   | $Cr_3Si$ | 6.43 | $Cr_5Ge_3$ | 7.49 |
|   | $Cr_5Si_3$ | 5.87 | $Cr_{11}Ge_{19}$ | 7.36 |
|   |   |   | $Cr_{11}Ge_8$ | 7.46 |
| Pt | PtSi | 12.53 | PtGe | 13.82 |
|   | $Pt_2Si$ | 15.20 | $PtGe_2$ | 10.90 |
|   | $Pt_2Si_3$ | 10.34 | $Pt_2Ge_3$ | 11.73 |
|   | $Pt_3Si$ | 17.19 | $Pt_3Ge$ | 18.22 |
|   | $Pt_6Si_5$ | 13.07 | $Pt_3Ge_2$ | 15.32 |
|   | $Pt_{12}Si_5$ | 16.11 |   |   |
| Pd | PdSi | 7.62 | PdGe | 9.44 |
|   | $Pd_2Si$ | 9.57 |   |   |
|   | $Pd_3Si$ | 10.12 |   |   |
|   | $Pd_9Si$ | 10.67 |   |   |
| Fe | FeSi | 6.14 | FeGe | 7.29 |
|   | $Fe_{0.92}Si_2$ | 4.85 | $FeGe_2$ | 7.72 |
|   | $Fe_{1.72}Si_{0.28}$ | 7.44 | $Fe_2Ge$ | 8.52 |
|   | $FeSi_2$ | 4.94 | $Fe_3Ge$ | 8.62 |
|   | $Fe_2Si$ | 6.42 | $Fe_6Ge_5$ | 8.09 |
|   | $Fe_3Si$ | 7.19 | $Fe_{6.5}Ge_4$ | 7.89 |
|   | $Fe_5Si_3$ | 6.47 | $Fe_{13}Ge_3$ | 8.19 |

FIG. 31

| | Si-based Compounds | Density (g/cm³) | Ge-based Compounds | Density (g/cm³) |
|---|---|---|---|---|
| Ni | $NiSi_2$ | 4.83 | – | |
| | NiSi | 5.93 | NiGe | 8.14 |
| | $Ni_{1.5}Si$ | 6.22 | $Ni_{1.48}Ge_{0.52}$ | 8.74 |
| | | | $Ni_{1.71}Ge$ | 8.62 |
| | $Ni_2Si$ | 7.37 | $Ni_{1.88}Ge$ | 8.97 |
| | $Ni_3Si$ | 7.87 | $Ni_2Ge$ | 8.87 |
| | $Ni_3Si_2$ | 6.75 | $Ni_3Ge$ | 9.06 |
| | $Ni_{31}Si_{12}$ | 7.56 | $Ni_5Ge_3$ | 8.59 |
| | | | $Ni_{19}Ge_{12}$ | 8.41 |
| Co | $CoSi_2$ | 4.98 | – | |
| | CoSi | 6.61 | CoGe | 8.12 |
| | $Co_2Si$ | 7.42 | $Co_{0.875}Ge_2$ | 7.49 |
| | | | $Co_{1.70}Ge$ | 8.64 |
| | | | $Co_5Ge_7$ | 7.86 |
| Mo | $MoSi_2$ | 6.26 | MoGe | 8.53 |
| | | | $MoGe_2$ | 8.90 |
| | $Mo_3Si$ | 8.93 | $Mo_3Ge$ | 9.98 |
| | $Mo_5Si_3$ | 8.21 | $Mo_5Ge_3$ | 9.63 |
| | | | $Mo_{13}Ge_{23}$ | 8.51 |
| W | $WSi_2$ | 9.82 | $WGe_2$ | 12.10 |
| | $W_3Si$ | 16.26 | | |
| | $W_5Si_3$ | 14.42 | | |
| Mg | $Mg_2Si$ | 1.99 | $Mg_2Ge$ | 3.10 |
| Al | – | – | $Al_{2.7}Ge_{0.3}$ | 3.40 |
| | | | $Al_{0.30}Ge_{0.70}$ | 5.81 |
| | | | $Al_{0.85}Ge_{0.15}$ | 3.35 |
| | | | $Al_6Ge_5$ | 3.95 |
| Au | – | – | $Au_{0.8}Ge_{0.2}$ | 17.30 |
| Cu | $Cu_{0.87}Si_{0.13}$ | 8.24 | $Cu_{0.83}Ge_{0.17}$ | 8.70 |
| | $Cu_{15}Si_4$ | 7.77 | $Cu_{2.5}Ge$ | 7.46 |
| | | | $Cu_3Ge$ | 8.62 |

SEMICONDUCTOR DEVICE AND METHOD FOR MANUFACTURING THE SAME

BACKGROUND OF THE INVENTION

1. Field of the Invention

The present invention relates to a semiconductor device, such as a Large Scale Integrated Circuit (LSI) or the like, and a method for manufacturing the same.

2. Description of the Related Art

In recent years, attention has focused on a process of forming a fully silicided (FUSI) electrode structure as a next-generation semiconductor process.

A conventional method of forming the FUSI electrode structure will be described with reference to FIG. 32 (see Japanese Unexamined Patent Application Publication No. 2006-261282 (particularly, FIG. 1)). Initially, a polysilicon gate electrode is formed on a semiconductor substrate 1 with a gate oxide film 2 interposed therebetween, and thereafter, sidewall insulating films 4 are formed on sidewalls of the polysilicon gate electrode. Thereafter, source/drain regions 6 are formed by ion implantation, where the polysilicon gate electrode and the sidewall insulating films 4 are used as a mask. Thereafter, a refractory metal film is deposited on the semiconductor substrate 1, covering the polysilicon gate electrode, and then by annealing, the polysilicon gate electrode is fully silicided to form a FUSI gate electrode 3a while silicide layers 7a are formed in surface portions of the source/drain regions 6.

A process with a stress control may be employed so as to improve transistor performance. As an example of such a technique, a conventional method in which a liner nitride film is utilized will be described with reference to FIG. 33 (see Japanese Unexamined Patent Application Publication No. 2007-049166 (particularly, FIG. 1B)). Initially, a polysilicon gate electrode 13 is formed on an active region surrounded by an STI region 12 in a silicon substrate 11, and thereafter, sidewall spacers (not shown) are formed on both sides of the polysilicon gate electrode 13 with offset spacers 14 and oxide layers 15 interposed therebetween. Next, a pair of source/drain regions 17 is formed in portions of the silicon substrate 11 on both sides of the polysilicon gate electrode 13 by ion implantation, where the polysilicon gate electrode 13, the offset spacers 14, and the sidewall spacers are used as a mask. Next, silicide layers 18 are formed in upper portions of the polysilicon gate electrode 13 and the source/drain regions 17, and thereafter, the sidewall spacers are removed. Thereafter, a stress liner nitride film 19 is formed, covering the polysilicon gate electrode 13.

SUMMARY OF THE INVENTION

However, the device employing the FUSI electrode and the stress control method employing the liner nitride film as described above have the following problems.

Firstly, when a FUSI electrode made of fully-silicided polysilicon is employed as the gate electrode of each of an Nch transistor and a Pch transistor, a tensile stress is applied to the Nch transistor due to expansion of the electrode during silicidation, so that the performance of the Nch transistor is improved, while a tensile stress is similarly applied to the Pch transistor, so that the performance of the Pch transistor is hindered.

In addition, when a liner nitride film which is deposited, covering a transistor, in the method of a stress control of the transistor, it is necessary to increase the thickness of the liner nitride film as much as possible in order to improve the action of a stress caused by the liner nitride film. However, when the liner nitride film is thick, it is likely to become significantly difficult to secure a contact formation region between gate electrodes as the scale of integration increases, i.e., there is a problem with a manufacturing process. Also, a problem fatal to the device, such as a crystal defect due to a crack or the like, occurs in the liner nitride film.

In view of the problems described above, an object of the present invention is to provide a semiconductor device capable of a stress control even if the scale of integration is increased, and a method for manufacturing the semiconductor device.

To achieve the object, a semiconductor device according to the present invention includes an Nch transistor having a first gate electrode, and a Pch transistor having a second gate electrode. The first gate electrode and the second gate electrode are made of materials causing stresses of different magnitudes.

According to the semiconductor device of the present invention, different gate electrode materials are used between the Nch transistor and the Pch transistor. Thus, by using gate electrode materials causing stresses of desired magnitudes, depending on the type of each transistor, an appropriate stress control can be performed with respect to a channel region of each transistor without using a liner nitride film. Therefore, the performance of both the Nch transistor and the Pch transistor can be improved without the occurrence of a defect caused by a liner nitride film (e.g., a crystal defect due to a crack) or the like.

Note that, in order to obtain the above-described effect, a tensile stress caused by the material for the first gate electrode is preferably larger than a tensile stress caused by the material for the second gate electrode, or the density of the material for the first gate electrode is preferably higher than the density of the material for the second gate electrode. Alternatively, the first gate electrode and the second gate electrode may be made of silicide, the expansion coefficient during silicidation of a metal included in the first gate electrode may be larger than the expansion coefficient during silicidation of a metal included in the second gate electrode. Specifically, the first gate electrode may have a first alloy compound layer made of at least one of Zr—Ge, V—Ge, Ta—Si, Ta—Ge, Cr—Ge, Pt—Si, Pt—Ge, Pd—Si, Pd—Ge, Fe—Si, and Fe—Ge. In this case, the first gate electrode may further have a first conductive layer for a threshold control below the first alloy compound layer. The second gate electrode may have a second alloy compound layer made of at least one of Ni—Si, Ni—Ge, Co—Si, Co—Ge, Mo—Si, Mo—Ge, W—Si, W—Ge, Mg—Si, Mg—Ge, Al—Ge, Au—Ge, Cu—Si, and Cu—Ge. In this case, the second gate electrode may further have a second conductive layer for a threshold control below the second alloy compound layer.

Also, in the semiconductor device of the present invention, an insulating sidewall spacer may be formed on a side surface of each of the first gate electrode and the second gate electrode. In this case, the insulating sidewall spacer may have a laminated structure including a silicon oxide film and a silicon nitride film. Also, the height of the insulating sidewall spacer formed on the side surface of the first gate electrode may be higher than the height of the insulating sidewall spacer formed on the side surface of the second gate electrode. In this case, a stress on a channel region of the Pch transistor can be reduced, so that the performance of the Pch transistor can be further improved.

Also, in the semiconductor device of the present invention, a trench-shaped isolation region having a depth in a range between 300 nm and 400 nm both inclusive may be provided between the Nch transistor and the Pch transistor.

Also, in the semiconductor device of the present invention, the height of each of the first gate electrode and the second gate electrode may be between 150 nm and 200 nm both inclusive.

Also, in the semiconductor device of the present invention, a gate insulating film having a thickness in a range between 1 nm and 3 nm both inclusive is provided below each of the first gate electrode and the second gate electrode.

An Nch transistor according to the present invention includes a gate electrode having a stress control layer made of at least one alloy compound of Zr—Ge, V—Ge, Ta—Si, Ta—Ge, Cr—Ge, Pt—Si, Pt—Ge, Pd—Si, Pd—Ge, Fe—Si, and Fe—Ge.

According to the Nch transistor of the present invention, the gate electrode has a stress control layer made of a material which causes a relatively large stress. Thereby, an appropriate stress control can be performed with respect to a channel region of the Nch transistor without using a liner nitride film. Therefore, the performance of the Nch transistor can be improved without the occurrence of a defect caused by a liner nitride film (e.g., a crystal defect due to a crack) or the like.

A Pch transistor according to the present invention includes a gate electrode having a stress control layer made of at least one alloy compound of Ni—Si, Ni—Ge, Co—Si, Co—Ge, Mo—Si, Mo—Ge, W—Si, W—Ge, Mg—Si, Mg—Ge, Al—Ge, Au—Ge, Cu—Si, and Cu—Ge.

According to the Pch transistor of this embodiment, the gate electrode has a stress control layer made of a material which causes a relatively small stress. Thereby, an appropriate stress control can be performed with respect to a channel region of the Pch transistor without using a liner nitride film. Therefore, the performance of the Pch transistor can be improved without the occurrence of a defect caused by a liner nitride film (e.g., a crystal defect due to a crack) or the like.

A method for manufacturing a semiconductor device according to the present invention includes (a) forming a first gate electrode on an Nch transistor formation region in a substrate, and (b) forming a second gate electrode on a Pch transistor formation region in the substrate. The first gate electrode and the second gate electrode are made of materials causing stresses of different magnitudes.

According to the semiconductor device manufacturing method of the present invention, different gate electrode materials are used between the Nch transistor and the Pch transistor. Thus, by using gate electrode materials causing stresses of desired magnitudes, depending on the type of each transistor, an appropriate stress control can be performed with respect to a channel region of each transistor without using a liner nitride film. Therefore, the performance of both the Nch transistor and the Pch transistor can be improved without the occurrence of a defect caused by a liner nitride film (e.g., a crystal defect due to a crack) or the like.

Specifically, in order to obtain the above-described effect, the semiconductor device manufacturing method of the present invention further includes, prior to the steps (a) and (b), (c) forming a silicon-containing film on the substrate, and (d) performing patterning with respect to the silicon-containing film to form a first silicon-containing film pattern which is to become the first gate electrode on the Nch transistor formation region in the substrate, and a second silicon-containing film pattern which is to become the second gate electrode on the Pch transistor formation region in the substrate. The step (a) includes forming a first metal film at least on the first silicon-containing film pattern before performing a first silicidation thermal treatment to form the first gate electrode.

The step (b) includes forming a second metal film at least on the second silicon-containing film pattern before performing a second silicidation thermal treatment to form the second gate electrode. The expansion coefficient during silicidation of a metal included in the first metal film is larger than the expansion coefficient during silicidation of a metal included in the second metal film. In this case, the semiconductor device manufacturing method may further include, prior to the step (c), forming, on the substrate, an isolation region for separating the Nch transistor formation region and the Pch transistor formation region, and forming a gate insulating film on the substrate. The semiconductor device manufacturing method may further include (g1) forming a hard mask on each of the first silicon-containing film pattern and the second silicon-containing film pattern, the step (g1) being provided subsequent to the step (d) and prior to the steps (a) and (b), (g2) removing the hard mask formed on the first silicon-containing film pattern, the step (g2) being provided between the steps (g1) and (a), and (g3) removing the hard mask formed on the second silicon-containing film pattern, the step (g3) being provided between the steps (g1) and (b). The semiconductor device manufacturing method may further include, subsequent to the step (d) and prior to the steps (a) and (b), (j1) forming an insulating sidewall spacer on a side surface of each of the first silicon-containing film pattern and the second silicon-containing film pattern. In this case, the semiconductor device manufacturing method may further include (j2) forming an LDD region in each of the Nch transistor formation region and the Pch transistor formation region in the substrate, the step (j2) being provided subsequent to the step (d) and prior to the step (j1), and (j3) forming source/drain regions in the Nch transistor formation region and the Pch transistor formation region in the substrate, the step (j3) being provided subsequent to the step (j1) and prior to the steps (a) and (b). The first silicon-containing film pattern and the second silicon-containing film pattern may each have a thickness in a range between 40 nm and 60 nm both inclusive, and the first metal film and the second metal film may each have a thickness in a range between 5 nm and 15 nm both inclusive. In each of the first silicidation thermal treatment and the second silicidation thermal treatment, a rapid thermal process may be performed in two steps at a reaction temperature in a range between 400° C. and 600° C. both inclusive.

Alternatively, in order to obtain the above-described effect, in the semiconductor device manufacturing method, the step (a) preferably includes forming a first conductive material film at least on the Nch transistor formation region in the substrate before performing patterning with respect to the first conductive material film to form the first gate electrode, the step (b) preferably includes forming a second conductive material film at least on the Pch transistor formation region in the substrate before performing patterning with respect to the second conductive material film to form the second gate electrode, and a tensile stress caused by the first conductive material film is preferably larger than a tensile stress caused by the second conductive material film. In this case, the semiconductor device manufacturing method may further include, prior to the steps (a) and (b), forming, on the substrate, an isolation region for separating the Nch transistor formation region and the Pch transistor formation region, and forming a gate insulating film on the substrate. The semiconductor device manufacturing method may further include, subsequent to the steps (a) and (b), (k1) forming an insulating sidewall spacer on a side surface of each of the first gate electrode and the second gate electrode. The semiconductor device manufacturing method may further include (k2) forming an LDD region in each of the Nch transistor formation region and the Pch transistor formation region in the substrate, the step (k2) being provided subsequent to the steps (a) and (b) and prior to the step (k1), and (k3) forming source/drain regions in each of the Nch transistor formation region and the Pch transistor formation region in the substrate, the step (k3) being provided subsequent to the step (k1).

Also, in the semiconductor device manufacturing method, the step (a) may be performed prior to the step (b).

As described above, the present invention relates to a semiconductor device and a method for manufacturing the semiconductor device. The present invention has the effect of enabling a stress control with respect to a channel region of a transistor without the occurrence of a defect or the like even in a miniaturization process or in a device having both an Nch transistor and a Pch transistor, and therefore, is considerably useful.

BRIEF DESCRIPTION OF THE DRAWINGS

FIGS. 7A and 7B are cross-sectional views showing steps of the method for manufacturing the semiconductor device of the first embodiment of the present invention.

FIGS. 8A and 8B are cross-sectional views showing steps of the method for manufacturing the semiconductor device of the first embodiment of the present invention.

FIGS. 9A and 9B are cross-sectional views showing steps of the method for manufacturing the semiconductor device of the first embodiment of the present invention.

FIGS. 10A and 10B are cross-sectional views showing steps of the method for manufacturing the semiconductor device of the first embodiment of the present invention.

FIGS. 11A and 11B are cross-sectional views showing steps of the method for manufacturing the semiconductor device of the first embodiment of the present invention.

FIGS. 12A and 12B are cross-sectional views showing steps of the method for manufacturing the semiconductor device of the first embodiment of the present invention.

FIGS. 13A and 13B are cross-sectional views showing steps of the method for manufacturing the semiconductor device of the first embodiment of the present invention.

FIGS. 17A and 17B are cross-sectional views showing steps of a method for manufacturing the semiconductor device of the second embodiment of the present invention.

FIGS. 18A and 18B are cross-sectional views showing steps of the method for manufacturing the semiconductor device of the second embodiment of the present invention.

FIGS. 19A and 19B are cross-sectional views showing steps of the method for manufacturing the semiconductor device of the second embodiment of the present invention.

FIGS. 21A and 21B are cross-sectional views showing steps of the method for manufacturing the semiconductor device of the second embodiment of the present invention.

FIGS. 23A and 23B are cross-sectional views showing steps of the method for manufacturing the semiconductor device of the second embodiment of the present invention.

FIGS. 26A and 26B are cross-sectional views showing steps of the method for manufacturing the semiconductor device of the second embodiment of the present invention.

FIG. 30 is a diagram showing the densities of compounds which can be used as a gate electrode material for the semiconductor devices of the first and second embodiments of the present invention.

FIG. 31 is a diagram showing the densities of compounds which can be used as a gate electrode material for the semiconductor devices of the first and second embodiments of the present invention.

DETAILED DESCRIPTION OF THE PREFERRED EMBODIMENTS

First Embodiment

Hereinafter, a semiconductor device according to a first embodiment of the present invention and a method for manufacturing the semiconductor device will be described with reference to the accompanying drawings.

Figure 1:
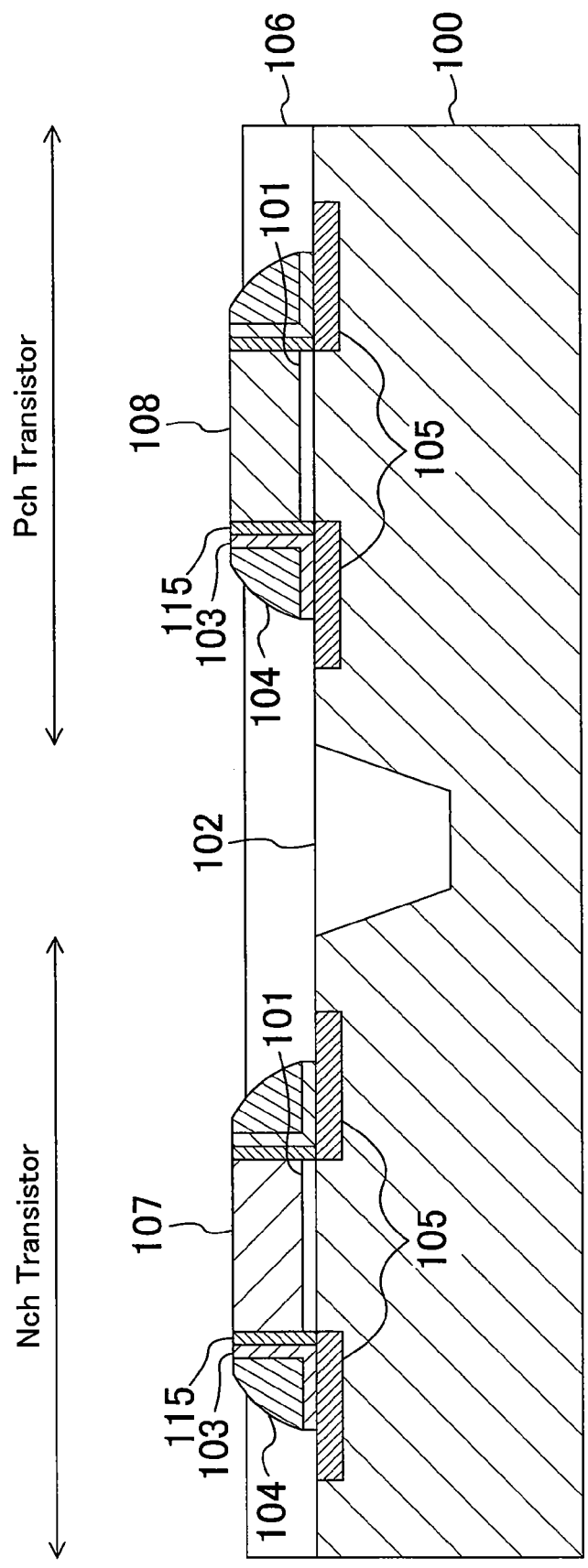
FIG. 1 is a cross-sectional view showing a structure of a gate electrode and its vicinity of a semiconductor device according to a first embodiment of the present invention.

FIG. 1 is a cross-sectional view showing a structure of a gate electrode and its vicinity of the semiconductor device of the first embodiment.

As shown in FIG. 1, an isolation region 102 which separates an Nch transistor formation region and a Pch transistor formation region is formed on a (100) principal plane of a substrate 100 made of, for example, silicon. For example, the isolation region 102 is formed by burying a high density plasma-non-doped silicate glass (HDP-NSG) film in an isolation trench having a depth in a range between 300 mn and 400 nm both inclusive formed in the substrate 100. A fully-silicided first gate electrode 107 is formed on the Nch transistor formation region in the substrate 100 with a gate insulating film 101 interposed therebetween. A fully-silicided second gate electrode 108 is formed on the Pch transistor formation region in the substrate 100 with the gate insulating film 101 interposed therebetween. For example, the gate insulating film 101 has a thickness in a range between 1 nm and 3 nm both inclusive, and the gate electrodes 107 and 108 each have a height in a range between 150 nm and 200 nm both inclusive. An offset spacer 115 and an inner sidewall spacer 103 and an outer sidewall spacer 104 are successively formed on each of sidewalls of the gate electrodes 107 and 108. Also, source/drain regions 105 are formed on both sides of each of the first gate electrode 107 and the second gate electrode 108 in the substrate 100. Surface portions of the source/drain regions 105 are silicided. Surfaces of the substrate 100 other than the top surfaces of the gate electrodes 107 and 108 are covered with an insulating film 106 made of, for example, a self align silicided-non-doped silicate glass (SA-NSG) film or the like.

A feature of this embodiment is that the first gate electrode 107 and the second gate electrode 108 are made of materials causing stresses of different magnitudes. Thus, by using gate electrode materials causing stresses of desired magnitudes, depending on the type of each transistor, an appropriate stress control can be performed with respect to a channel region of each transistor without using a liner nitride film. Therefore, the performance of both the Nch transistor and the Pch transistor can be improved without the occurrence of a defect caused by a liner nitride film (e.g., a crystal defect due to a crack) or the like.

Note that, in order to obtain the above-described effect in the semiconductor device of this embodiment, a tensile stress caused by the material for the first gate electrode 107 is preferably larger than that caused by the material for the second gate electrode 108, or the density of the material for the first gate electrode 107 is preferably higher than that of the material for the second gate electrode 108. Alternatively, the expansion coefficient during silicidation of a metal included in the first gate electrode 107 is preferably larger than that of a metal included in the second gate electrode 108.

Specifically, in the semiconductor device of this embodiment, the first gate electrode 107 may be made of a silicide material which causes a relatively large stress, such as Ta—Si, Pt—Si, Pd—Si, Fe—Si or the like. The second gate electrode 108 may be made of a silicide material which causes a relatively small stress, such as Ni—Si, Co—Si, Mo—Si, W—Si, Mg—Si, Cu—Si or the like. Note that the materials for the gate electrodes 107 and 108 are not particularly limited. For example, a compound having a relatively high density which can be used as the material for the first gate electrode 107, and a compound having a relatively low density which can be used as the material for the second gate electrode 108, may be selected from Si-containing metal compounds having densities shown in FIGS. 30 and 31 (see a database station provided by the "National Institute for Materials Science").

Although the same gate insulating film 101 is formed below the gate electrodes 107 and 108 in this embodiment, different gate insulating films may be formed below the gate electrodes 107 and 108.

Next, a method for manufacturing the semiconductor device of the first embodiment will be described. FIGS. 2A and 2B, FIGS. 3A and 3B, FIGS. 4A and 4B, FIGS. 5A and 5B, FIGS. 6A and 6B, FIGS. 7A and 7B, FIGS. 8A and 8B, FIGS. 9A and 9B, FIGS. 10A and 10B, FIGS. 11A and 11B, FIGS. 12A and 12B, and FIGS. 13A and 13B are cross-sectional views showing steps of the method for manufacturing the semiconductor device of the first embodiment.

Figure 2A:
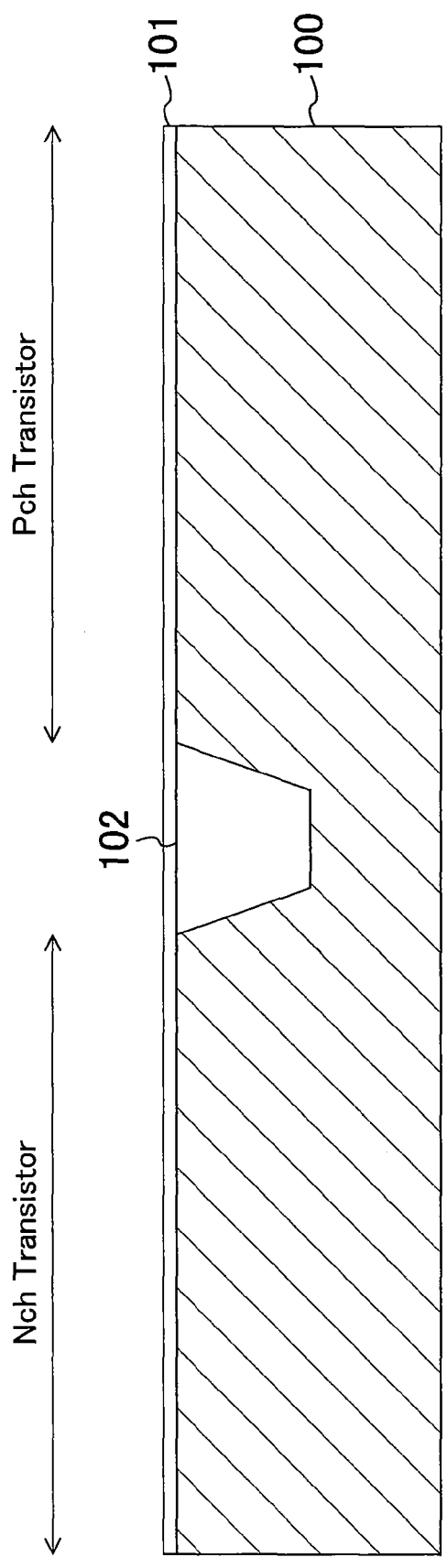
FIGS. 2A and 2B are cross-sectional views showing steps of a method for manufacturing the semiconductor device of the first embodiment of the present invention.

Initially, as shown in FIG. 2A, the isolation region 102 for separating the Nch transistor formation region and the Pch transistor formation region is formed on the (100) principal plane of the substrate 100 made of, for example, silicon. For example, the isolation region 102 is formed by burying an HDP-NSG film in an isolation trench having a depth in a range between 300 nm and 400 nm both inclusive formed in the substrate 100.

Next, although it is not shown, phosphorous implantation for N-well formation is performed with, for example, an implantation energy of 250 to 600 keV and an implantation dose of $1\times10^{13}$ to $5\times10^{13}$ cm$^{-2}$, and arsenic implantation is then performed with, for example, an implantation energy of 50 to 100 keV and an implantation dose of $1\times10^{11}$ to $5\times10^{11}$ cm$^{-2}$, where regions other than an N-well formation region are masked. Following this, boron implantation for P-well formation is performed with, for example, an implantation energy of 10 to 300 keV and an implantation dose of $1\times10^{11}$ to $1\times10^{14}$ cm$^{-2}$, where regions other than a P-well formation region are masked. Thereafter, post-implantation annealing is performed at a temperature of, for example, 700 to 900° C.

Next, as shown in FIG. 2A, gate oxidation is performed at a temperature of 1000 to 1100° C. using, for example, an oxygen radical oxidation furnace or the like. Thereby, the gate insulating film 101 made of a silicon oxide film having a thickness of, for example, 2 to 5 nm is formed on the principal plane of the substrate 100.

Next, although it is not shown, arsenic implantation for Pch lightly doped drain (LDD) formation is performed with, for example, an implantation energy of 3 to 10 keV and an implantation dose of $1\times10^{14}$ to $3\times10^{14}$ cm$^{-2}$, where regions other than a Pch lightly doped drain (LDD) formation region are masked. Thereafter, boron implantation for Nch LDD formation is performed with, for example, an implantation energy of 10 to 15 keV and an implantation dose of $1\times10^{12}$ to $1\times10^{13}$ cm$^{-2}$, where regions other than an Nch LDD formation region are masked. Thereafter, post-implantation annealing is performed at a temperature of, for example, 800 to 1000° C.

Figure 2B:
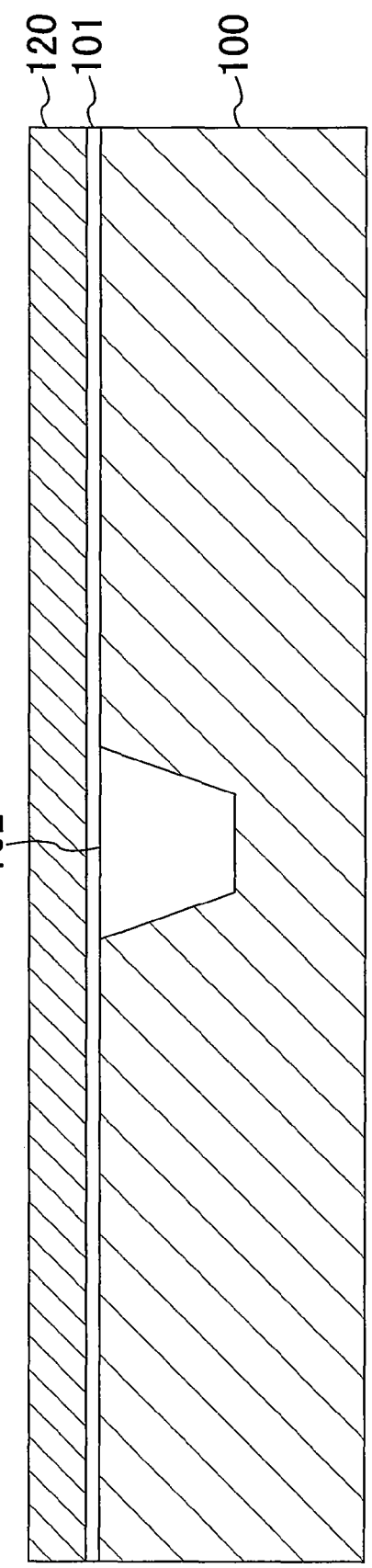

Next, as shown in FIG. 2B, a polysilicon film 120 having a thickness of 30 to 100 nm is deposited on the principal plane of the substrate 100 at a temperature of 400 to 600° C. using a chemical vapor deposition (CVD) device or the like.

Figure 3A:
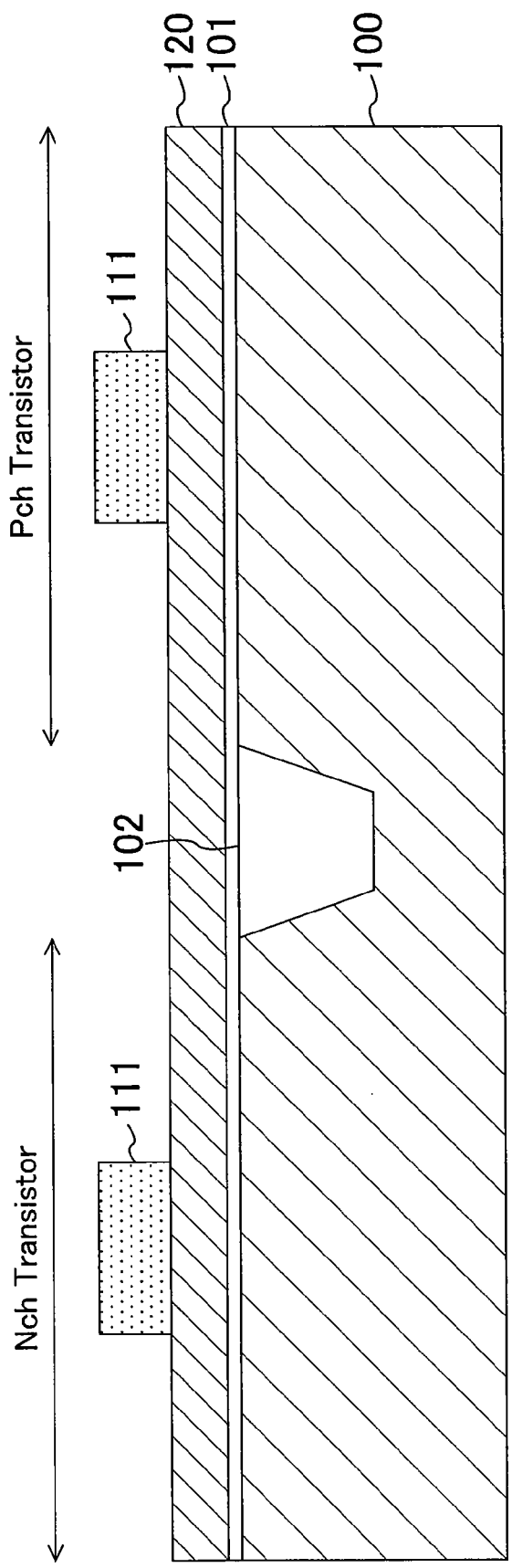
FIGS. 3A and 3B are cross-sectional views showing steps of the method for manufacturing the semiconductor device of the first embodiment of the present invention.
Figure 3B:
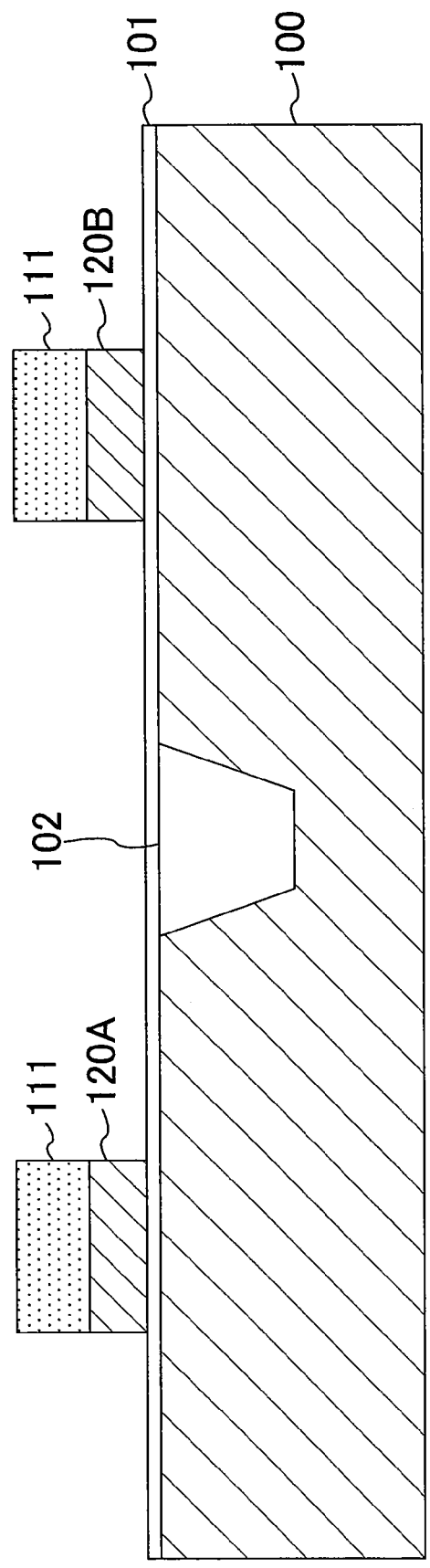
Figure 4A:
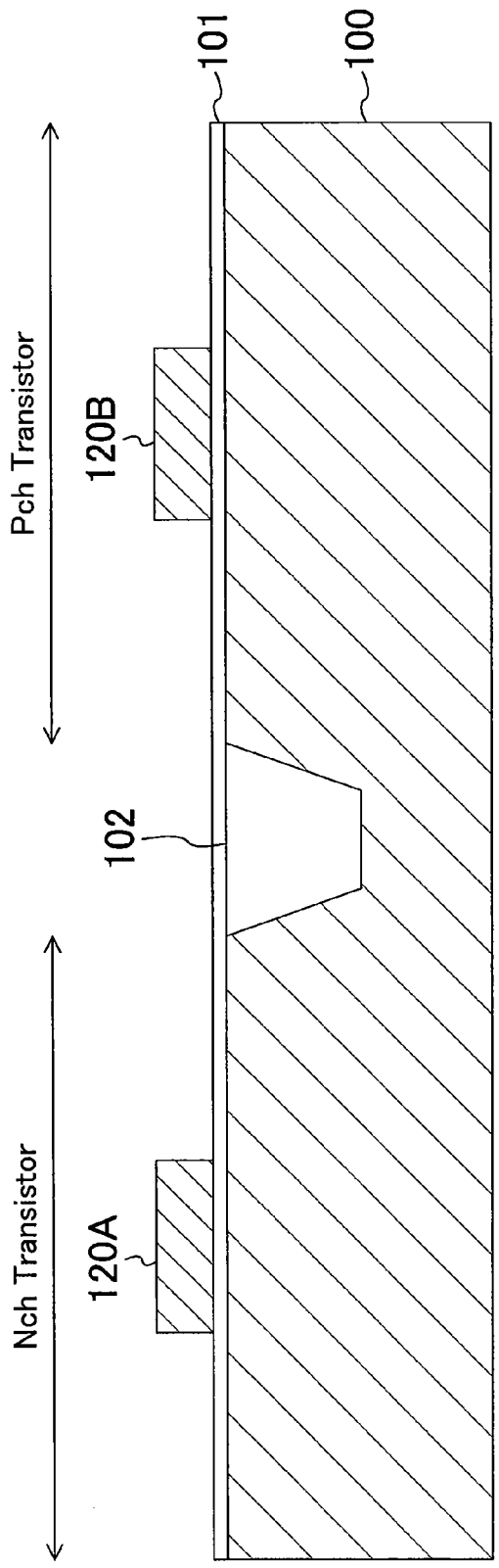
FIGS. 4A and 4B are cross-sectional views showing steps of the method for manufacturing the semiconductor device of the first embodiment of the present invention.

Next, as shown in FIG. 3A, a resist pattern 111 is formed on the polysilicon film 120, covering a gate electrode formation region. Next, as shown in FIG. 3B, dry etching is performed with respect to the polysilicon film 120 using, for example, CF-based gas, where the resist pattern 111 is used as a mask, thereby etching back and removing the polysilicon film 120 from a region which is not masked. Thereafter, as shown in FIG. 4A, the resist pattern 111 is removed by cleaning with, for example, a mixture of sulfuric acid and hydrogen peroxide solution. Thereby, polysilicon film patterns 120A and 120B are left on the Nch transistor formation region and the Pch transistor formation region, respectively, in the substrate 100.

Figure 4B:
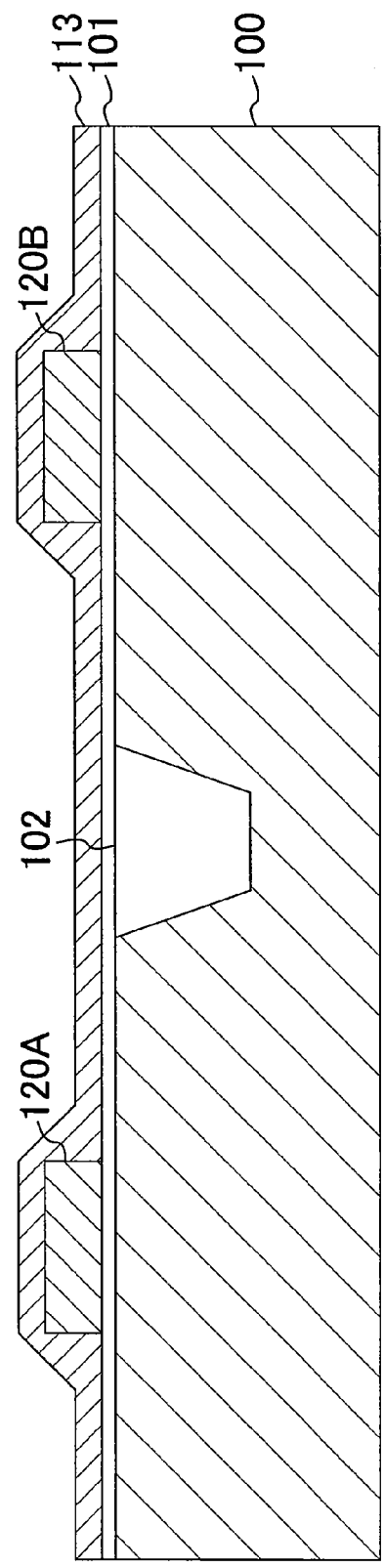

Next, as shown in FIG. 4B, a hard mask film 113 having a thickness of 120 to 160 nm is deposited on an entire surface of the substrate 100 using, for example, a vertical batch furnace or the like at a temperature of 300 to 600° C.

Figure 5A:
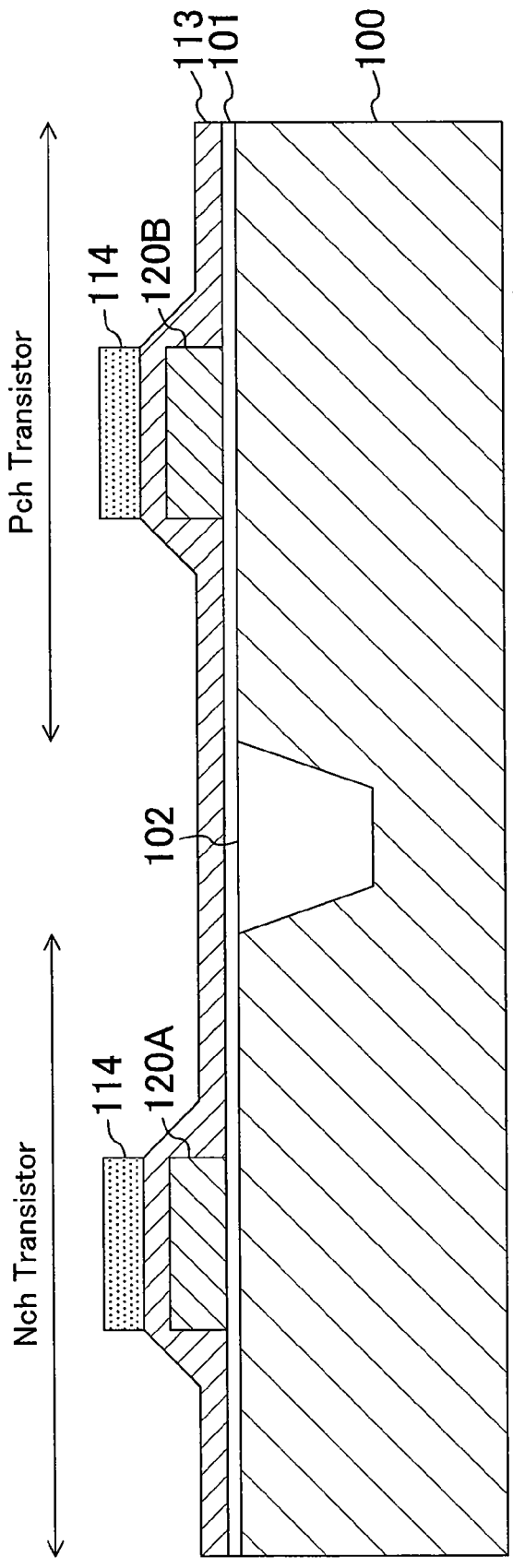
FIGS. 5A and 5B are cross-sectional views showing steps of the method for manufacturing the semiconductor device of the first embodiment of the present invention.
Figure 5B:
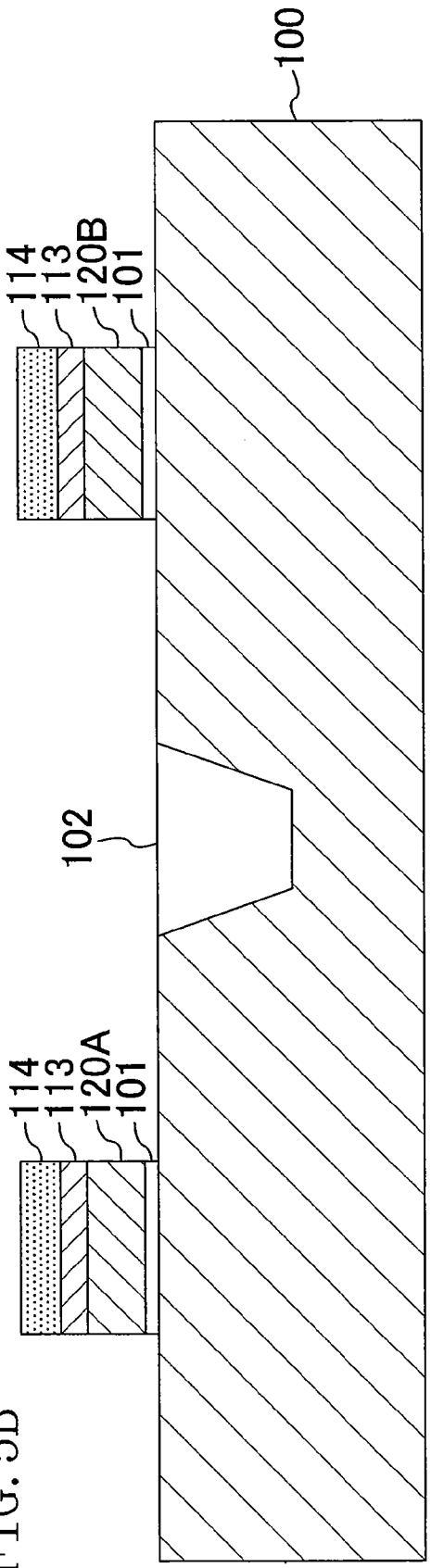
Figure 6A:
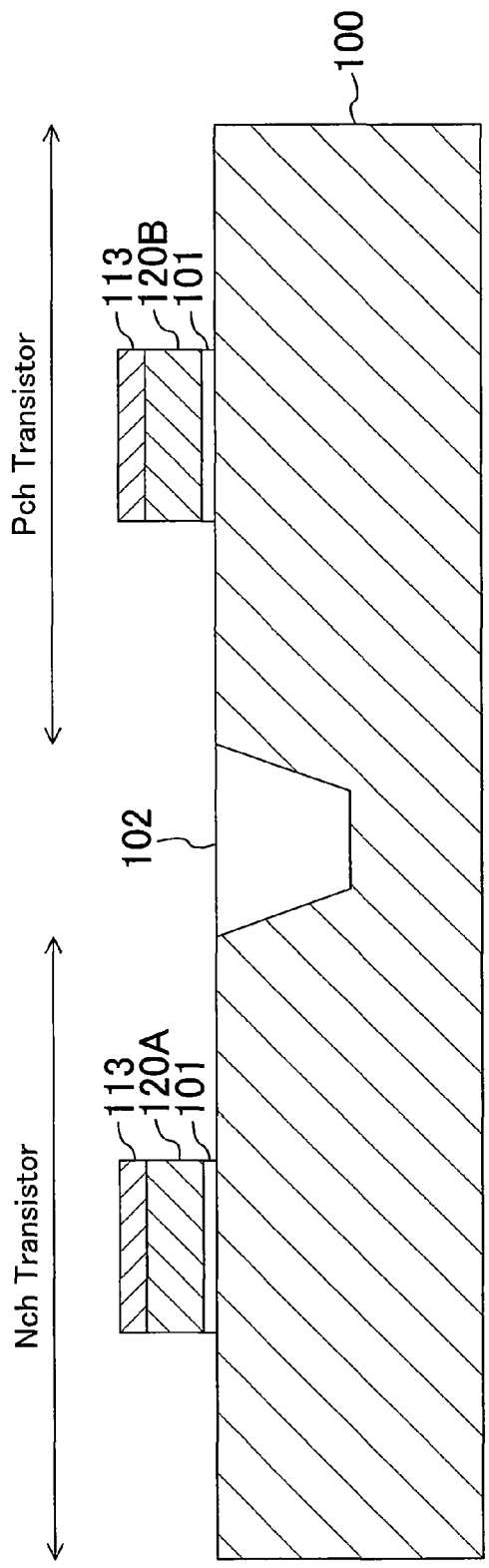
FIGS. 6A and 6B are cross-sectional views showing steps of the method for manufacturing the semiconductor device of the first embodiment of the present invention.

Next, as shown in FIG. 5A, a resist pattern 114 is formed on the hard mask film 113, covering the gate electrode formation region. Next, as shown in FIG. 5B, etching is performed with respect to the hard mask film 113 and the gate insulating film 101, where the resist pattern 114 is used as a mask, thereby etching back and removing the hard mask film 113 and the gate insulating film 101 from regions which are not masked. Thereafter, as shown in FIG. 6A, the resist pattern 114 is removed by cleaning with, for example, a mixture of sulfuric acid and hydrogen peroxide solution.

Figure 6B:
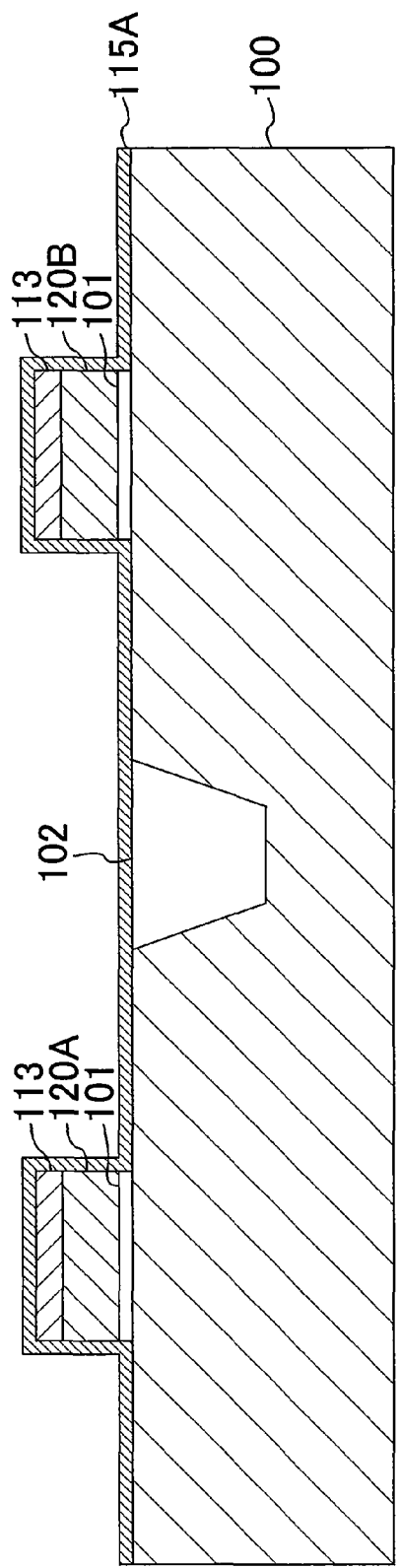

Next, as shown in FIG. 6B, oxidation is performed at a temperature of 800 to 1000° C. using, for example, a vertical batch furnace or the like, thereby forming a silicon oxide film 115A having a thickness of, for example, 10 to 20 nm on an entire surface of the substrate 100. Next, as shown in FIG. 7A, etch back is performed with respect to the silicon oxide film 115A so that surfaces of the hard mask film 113 on the polysilicon film patterns 120A and 120B and surfaces other than the gate electrode formation region of the substrate 100 are exposed, and the silicon oxide film 115A (i.e., the offset spacers 115) is left on side surfaces of the polysilicon film patterns 120A and 120B.

Next, as shown in FIG. 7B, a silicon oxide film 103A having a thickness of 10 to 20 nm is deposited on an entire surface of the substrate 100 at a temperature of 300 to 600° C. using, for example, a vertical batch furnace or the like. Following this, as shown in FIG. 8A, a silicon nitride film 104A having a thickness of 50 to 100 nm is deposited on an entire surface of the substrate 100 at a temperature of 500 to 1000° C. using, for example, a vertical batch furnace or the like. Next, as shown in FIG. 8B, etch back is performed with respect to the silicon nitride film 104A at a temperature of, for example, 200 to 400° C. so that the silicon nitride film 104A having a thickness of 50 to 90 nm (i.e., the outer sidewall spacers 104) is left on side surfaces of the polysilicon film patterns 120A and 120B, and a surface of the substrate 100 in an active region between the gate electrode formation regions is exposed, extending over a width of, for example, 20 to 60 nm. Also, in this case, the silicon oxide film 103A (i.e., the inner sidewall spacers 103) is interposed between the outer sidewall spacers 104 and the offset spacers 115.

Next, although it is not shown, boron implantation for Pch source/drain formation is performed with, for example, an implantation energy of 2 to 20 keV and an implantation dose $5\times10^{12}$ to $1\times10^{15}$ cm$^{-2}$, where regions other than the Pch source/drain formation regions are masked. Following this, arsenic implantation for Nch source/drain formation is performed with, for example, an implantation energy of 10 to 20 keV and an implantation dose of $1\times10^{14}$ to $1\times10^{16}$ cm$^{-2}$, and phosphorous implantation is then performed with, for example, an implantation energy of 15 to 30 keV and an implantation dose of $1\times10^{12}$ to $1\times10^{14}$ cm$^{-2}$, where regions other than the Nch source/drain formation regions are masked. Thereafter, surface portions of the thus-formed source/drain regions may be silicided.

Next, as shown in FIG. 9A, the insulating film 106 made of an SA-NSG film having a thickness of 100 to 200 nm is deposited on an entire surface of the substrate 100 at a temperature of 500 to 700° C. using, for example, a CVD device or the like. Next, as shown in FIG. 9B, etch back is performed so that the insulating film 106 is left, having a thickness of about 50 to 100 nm. Thereby, the hard mask film 113 on the polysilicon film pattern 120A and 120B is exposed.

Next, as shown in FIG. 10A, a resist pattern 116 is formed to cover the hard mask film 113 on the polysilicon film pattern 120B in the Pch transistor formation region, and thereafter, as shown in FIG. 10B, the hard mask film 113 on the polysilicon film pattern 120A in the Nch transistor formation region is selectively etched and removed. Thereby, a surface of the polysilicon film pattern 120A is exposed. In this case, upper portions of the offset spacers 115, the inner sidewall spacers 103, and the outer sidewall spacers 104 formed on the side surfaces of the polysilicon film pattern 120A are also etched and removed. Also, in this case, etch back may be performed in a manner which allows the polysilicon film pattern 120A to be left, having a thickness of about 40 to 60 nm. Thereafter, as shown in FIG. 11A, the resist pattern 116 is removed.

Next, as shown in FIG. 11B, a first metal film 117 made of Ni, Co, W, Mg, Al, Au, Cu, Ti, Zr, V, Ta, Cr, Pt, Pd, Fe or the like having a thickness of 5 to 15 nm is formed on an entire surface of the substrate 100 by, for example, sputtering. Thereafter, as shown in FIG. 12A, a first silicidation thermal treatment is performed so as to fully silicidate the polysilicon film pattern 120A, thereby forming the first gate electrode 107 (fully silicided electrode). Here, the first silicidation thermal treatment may be performed by conducting a Rapid Thermal Process (RTP) in two steps at a temperature of, for example, 400 to 600° C. After the first silicidation thermal treatment, an unreacted portion of the first metal film 117 is selectively removed.

Next, as shown in FIG. 12B, the hard mask film 113 on the polysilicon film pattern 120B in the Pch transistor formation region is selectively etched and removed. Thereby, a surface of the polysilicon film pattern 120B is exposed. In this case, upper portions of the offset spacers 115, the inner sidewall spacers 103, and the outer sidewall spacers 104 formed on the side surfaces of the polysilicon film pattern 120B are also etched and removed. Also, in this case, etch back may be performed in a manner which allows the polysilicon film pattern 120B to be left, having a thickness of about 40 to 60 nm.

Next, as shown in FIG. 13A, a second metal film 118 made of Ni, Co, W, Mg, Al, Au, Cu, Ti, Zr, V, Ta, Cr, Pt, Pd, Fe or the like having a thickness of 5 to 15 nm is formed on an entire surface of the substrate 100 by, for example, sputtering. Here, the expansion coefficient during silicidation of the metal included in the second metal film 118 is smaller than that of the metal included in the first metal film 117. Thereafter, as shown in FIG. 13B, a second silicidation thermal treatment is performed for full silicidation of the polysilicon film pattern 120B, thereby forming the second gate electrode 108 (fully silicided electrode). Here, the second silicidation thermal treatment may be performed by conducting RTP in two steps at a temperature of 400 to 600° C. After the second silicidation thermal treatment, an unreacted portion of the second metal film 118 is selectively removed. Finally, surface portions of the fully-silicided gate electrodes 107 and 108 are planarized by, for example, chemical-mechanical polishing.

According to the above-described method of this embodiment, since the expansion coefficient during silicidation of the metal included in the second metal film 118 is smaller than that of the metal included in the first metal film 117, a tensile stress caused by the second gate electrode 108 is smaller than a tensile stress caused by the first gate electrode 107. In other words, by using gate electrode materials which cause stresses of desired magnitudes, depending on the type of each transistor, an appropriate stress control can be performed with respect to a channel region of each transistor without using a liner nitride film. Therefore, the performance of both the Nch transistor and the Pch transistor can be improved without the occurrence of a defect caused by a liner nitride film (e.g., a crystal defect due to a crack) or the like.

Note that, in the method of this embodiment, the material for the first metal film 117 is not particularly limited, and a material having a relatively high expansion coefficient during silicidation, such as Ta, Pt, Pd, Fe or the like, can be used. Also, the material for the second metal film 118 is not particularly limited, and a material having a relatively small expansion coefficient during silicidation, such as Ni, Co, Mo, W, Mg, Cu, or the like, can be used.

Also, in the method of this embodiment, the polysilicon film 120 is used for silicide formation. Instead of this, an amorphous silicon film or other silicon-containing films may be used.

First Variation of First Embodiment

Hereinafter, a semiconductor device according to a first variation of the first embodiment of the present invention and a method for manufacturing the semiconductor device will be described with reference to the drawings.

Figure 14:
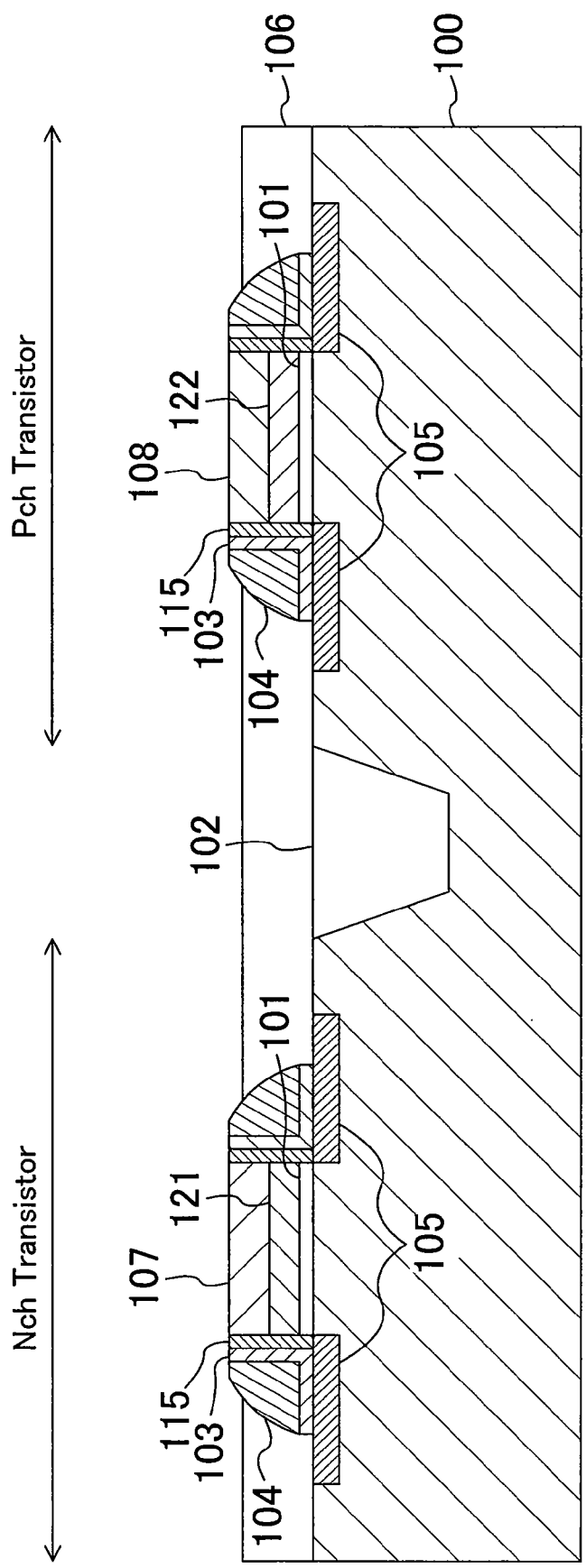
FIG. 14 is a cross-sectional view showing a structure of a gate electrode and its vicinity of a semiconductor device according to a first variation of the first embodiment of the present invention.

FIG. 14 is a cross-sectional view showing a structure of a gate electrode and its vicinity of the semiconductor device of the first variation of the first embodiment. Note that, in FIG. 14, the same parts as those of the first embodiment of FIG. 1 are indicated by the same reference numerals and will not be described.

As shown in FIG. 14, this variation is different from the first embodiment in that a conductive layer 121 made of, for example, polysilicon for a threshold control is formed between the silicidated first gate electrode 107 and the gate insulating film 101 in the Nch transistor, and a conductive layer 122 made of, for example, polysilicon for a threshold control is formed between the silicidated second gate electrode 108 and the gate insulating film 101 in the Pch transistor. Note that the conductive layers 121 and 122 each serve as a portion of the corresponding gate electrode.

According to this variation, the effect of facilitating a threshold control is obtained in addition to an effect similar to that of the first embodiment.

Second Variation of First Embodiment

Hereinafter, a semiconductor device according to a second variation of the first embodiment of the present invention and a method for manufacturing the semiconductor device will be described with reference to the drawings.

Figure 15:
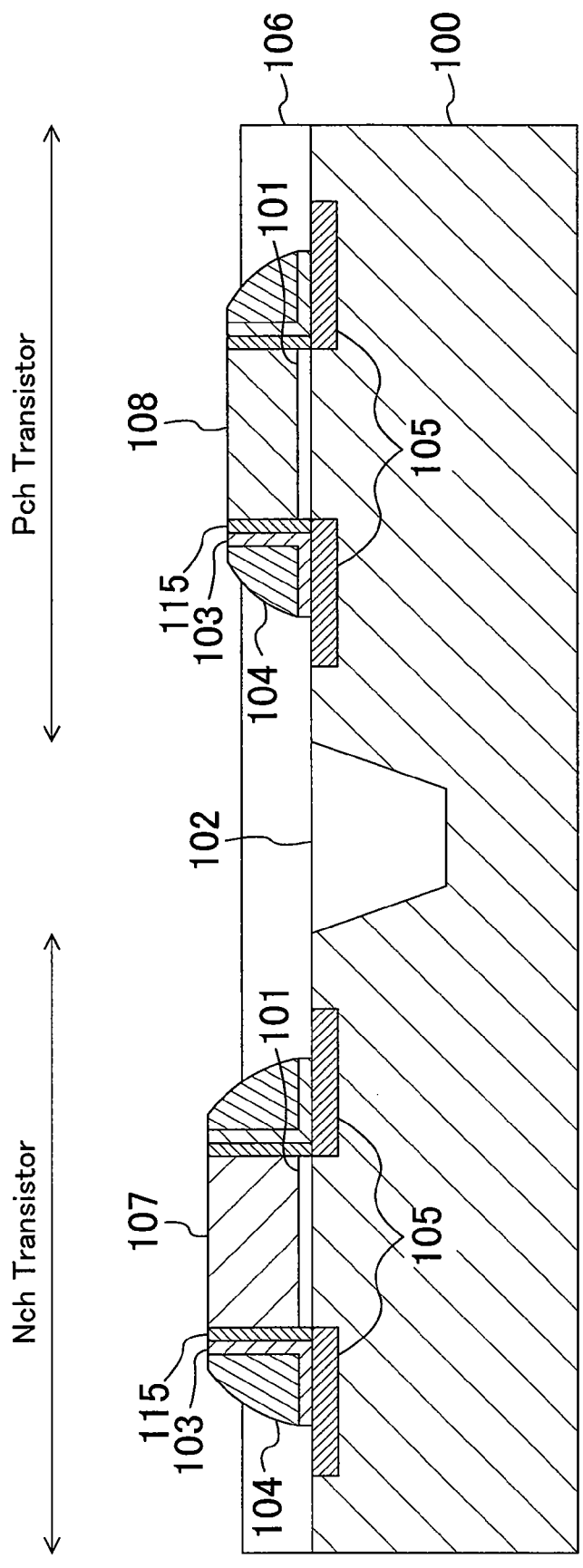
FIG. 15 is a cross-sectional view showing a structure of a gate electrode and its vicinity of a semiconductor device according to a second variation of the first embodiment of the present invention.

FIG. 15 is a cross-sectional view showing a structure of a gate electrode and its vicinity of the semiconductor device of the second variation of the first embodiment. Note that, in FIG. 15, the same parts as those of the first embodiment of FIG. 1 are indicated by the same reference numerals and will not be described.

As shown in FIG. 15, this variation is different from the first embodiment in that the height of the first gate electrode 107 in the Nch transistor is higher than the height of the second gate electrode 108 in the Pch transistor, and the heights of the offset spacers 115, the inner sidewall spacers 103, and the outer sidewall spacers 104 formed on the side surfaces of the first gate electrode 107 are higher than the heights of the offset spacers 115, the inner sidewall spacers 103, and the outer sidewall spacers 104 formed on the side surfaces of the second gate electrode 108, respectively.

According to this variation, in addition to an effect similar to that of the first embodiment, a stress on the channel region of the Pch transistor can be further reduced, so that the performance of the Pch transistor can be further improved.

Second Embodiment

Hereinafter, a semiconductor device according to a second embodiment of the present invention and a method for manufacturing the semiconductor device will be described with reference to the drawing.

Figure 16:
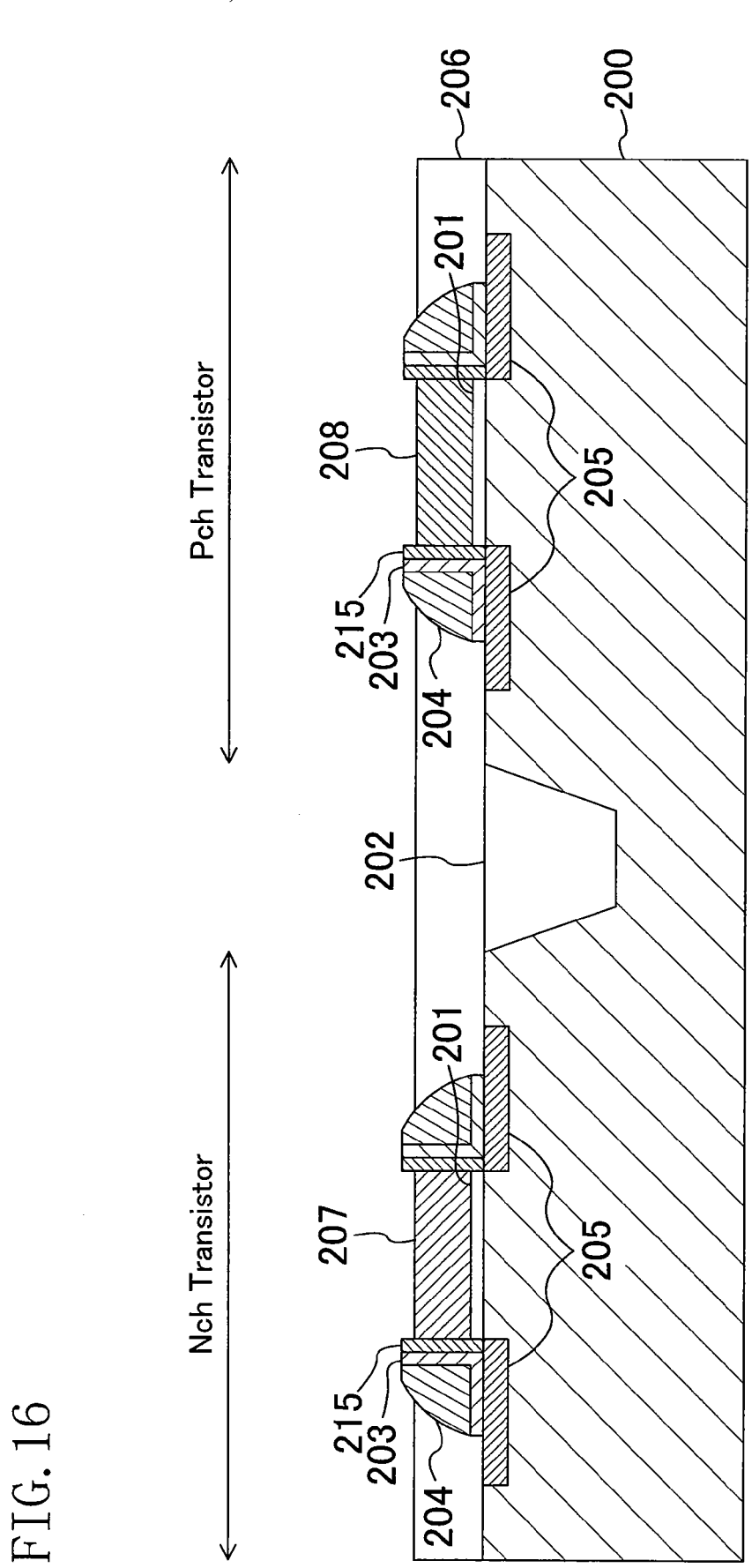
FIG. 16 is a cross-sectional view showing a structure of a gate electrode and its vicinity of a semiconductor device according to a second embodiment of the present invention.

FIG. 16 is a cross-sectional view showing a structure of a gate electrode and its vicinity of the semiconductor device of the second embodiment.

As shown in FIG. 16, an isolation region 202 which separates an Nch transistor formation region and a Pch transistor formation region is formed on a (100) principal plane of a substrate 200 made of, for example, silicon. For example, the isolation region 202 is formed by burying an HDP-NSG film in an isolation trench having a depth of 300 nm to 400 nm formed in the substrate 200. A first gate electrode 207 is formed on the Nch transistor formation region in the substrate 200 with a gate insulating film 201 interposed therebetween. A second gate electrode 208 is formed on the Pch transistor formation region in the substrate 200 with the gate insulating film 201 interposed therebetween. For example, the gate insulating film 201 has a thickness of 1 nm to 3 nm, and the gate electrodes 207 and 208 each have a height of 150 nm to 200 nm. An offset spacer 215 and an inner sidewall spacer 203 and an outer sidewall spacer 204 are successively formed on each of sidewalls of the gate electrodes 207 and 208. Also, source/drain regions 205 are formed on both sides of each of the first gate electrode 207 and the second gate electrode 208 in the substrate 200. Surface portions of the source/drain region 205 are silicided. Surfaces of the substrate 200 other than the top surfaces of the gate electrodes 207 and 208 are covered with an insulating film 206 made of, for example, an SA-NSG film or the like.

A feature of this embodiment is that the first gate electrode 207 and the second gate electrode 208 are made of materials causing stresses of different magnitudes. Thus, by using gate electrode materials causing stresses of desired magnitudes, depending on the type of each transistor, an appropriate stress control can be performed with respect to a channel region of each transistor without using a liner nitride film. Therefore, the performance of both the Nch transistor and the Pch transistor can be improved without the occurrence of a defect caused by a liner nitride film (e.g., a crystal defect due to a crack) or the like.

Note that, in order to obtain the above-described effect in the semiconductor device of this embodiment, a tensile stress caused by the material for the first gate electrode 207 is preferably larger than that caused by the material for the second gate electrode 208, or the density of the material for the first gate electrode 207 is preferably higher than that of the material for the second gate electrode 208.

Specifically, in the semiconductor device of this embodiment, the first gate electrode 207 may be made of an alloy compound material which causes a relatively large stress, such as Zr—Ge, V—Ge, Ta—Ge, Cr—Ge, Pt—Ge, Pd—Ge, Fe—Ge or the like. The second gate electrode 208 may be made of an alloy compound material which causes a relatively small stress, such as Ni—Ge, Co—Ge, Mo—Ge, W—Ge, Mg—Ge, Al—Ge, Au—Ge, Cu—Ge or the like. Note that the materials for the gate electrodes 207 and 208 are not particularly limited. For example, a compound having a relatively high density which can be used as the material for the first gate electrode 207, and a compound having a relatively low density which can be used as the material for the second gate electrode 208, may be selected from Ge-containing metal compounds having densities shown in FIGS. 30 and 31.

Although the same gate insulating film 201 is formed below the gate electrodes 207 and 208 in this embodiment, different gate insulating films may be formed below the gate electrodes 207 and 208.

Next, a method for manufacturing the semiconductor device of the second embodiment will be described. FIGS. 17A and 17B, FIGS. 18A and 18B, FIGS. 19A and 19B, FIGS. 20A and 20B, FIGS. 21A and 21B, FIGS. 22A and 22B, FIGS. 23A and 23B, FIGS. 24A and 24B, FIGS. 25A and 25B, FIGS. 26A and 26B, and FIG. 27 are cross-sectional views showing steps of the method for manufacturing the semiconductor device of the second embodiment.

Initially, as shown in FIG. 17A, the isolation region 202 for separating the Nch transistor formation region and the Pch transistor formation region is formed on the (100) principal plane of the substrate 200 made of, for example, silicon. For example, the isolation region 202 is formed by burying an HDP-NSG film in an isolation trench having a depth of 300 nm to 400 nm formed in the substrate 200.

Next, although it is not shown, phosphorous implantation for N-well formation is performed with, for example, an implantation energy of 250 to 600 keV and an implantation dose of $1\times10^{13}$ to $5\times10^{13}$ cm$^{-2}$, and arsenic implantation is then performed with, for example, an implementation energy of 50 to 100 keV and an implantation dose of $1\times10^{11}$ to $5\times10^{11}$ cm$^{-2}$, where regions other than an N-well formation region are masked. Following this, boron implantation for P-well formation is performed with, for example, an implantation energy of 10 to 300 keV and an implantation dose of $1\times10^{11}$ to $1\times10^{14}$ cm$^{-2}$, where regions other than a P-well formation region are masked. Thereafter, post-implantation annealing is performed at a temperature of, for example, 700 to 900° C.

Next, as shown in FIG. 17A, gate oxidation is performed at a temperature of 1000 to 1100° C. using, for example, an oxygen radical oxidation furnace or the like. Thereby, the gate insulating film 201 made of a silicon oxide film having a thickness of, for example, 2 to 5 nm is formed on the principal plane of the substrate 200.

Next, although it is not shown, arsenic implantation for Pch LDD formation is performed with, for example, an implantation energy of 3 to 10 keV and an implantation dose of $1\times10^{14}$ to $3\times10^{14}$ cm$^{-2}$, where regions other than a Pch LDD formation region are masked. Thereafter, boron implantation for Nch LDD formation is performed with, for example, an implantation energy of 10 to 15 keV and an implantation dose of $1\times10^{12}$ to $1\times10^{13}$ cm$^{-2}$, where regions other than an Nch LDD formation region are masked. Thereafter, post-implantation annealing is performed at a temperature of, for example, 800 to 1000° C.

Next, as shown in FIG. 17B, a first gate electrode material film 207A having a thickness of 100 to 150 nm made of a material having a density higher than that of the second gate electrode material is deposited on the principal plane of the substrate 200 at a temperature of 300 to 1000° C. using a chemical vapor deposition (CVD) device or the like.

Next, as shown in FIG. 18A, a resist pattern 211 is formed on the first gate electrode material film 207A, covering a gate electrode formation region in the Nch transistor. Next, as shown in FIG. 18B, dry etching is performed with respect to the first gate electrode material film 207A using, for example, CF-based gas, where the resist pattern 211 is used as a mask, thereby etching back and removing the first gate electrode material film 207A from a region which is not masked. Thereby, the first gate electrode 207 of the Nch transistor is formed. Thereafter, as shown in FIG. 19A, the resist pattern 211 is removed by cleaning with, for example, a mixture of sulfuric acid and hydrogen peroxide solution.

Next, as shown in FIG. 19B, a second gate electrode material film 208A having a thickness of 100 to 150 nm made of a material having a density lower than that of the first gate electrode material is deposited on the principal plane of the substrate 200 at a temperature of 300 to 1000° C. using, for example, a CVD device or the like. Here, a tensile stress caused by the second gate electrode material film 208A is smaller than a tensile stress caused by the first gate electrode material film 207A.

Figure 20A:
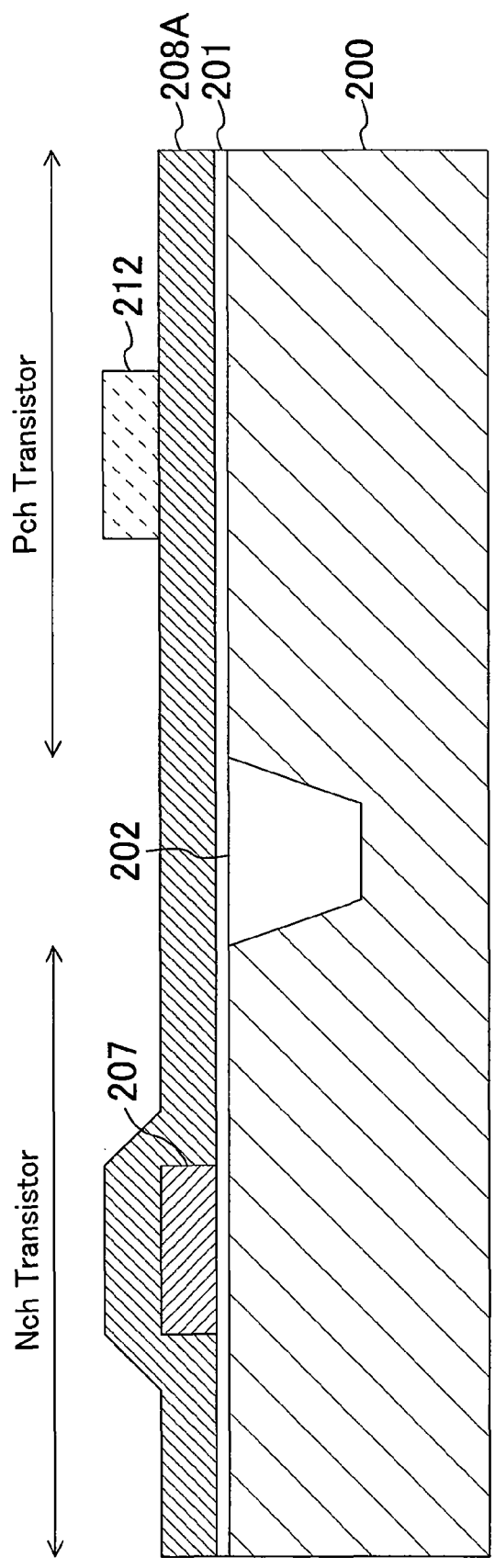
FIGS. 20A and 20B are cross-sectional views showing steps of the method for manufacturing the semiconductor device of the second embodiment of the present invention.
Figure 20B:
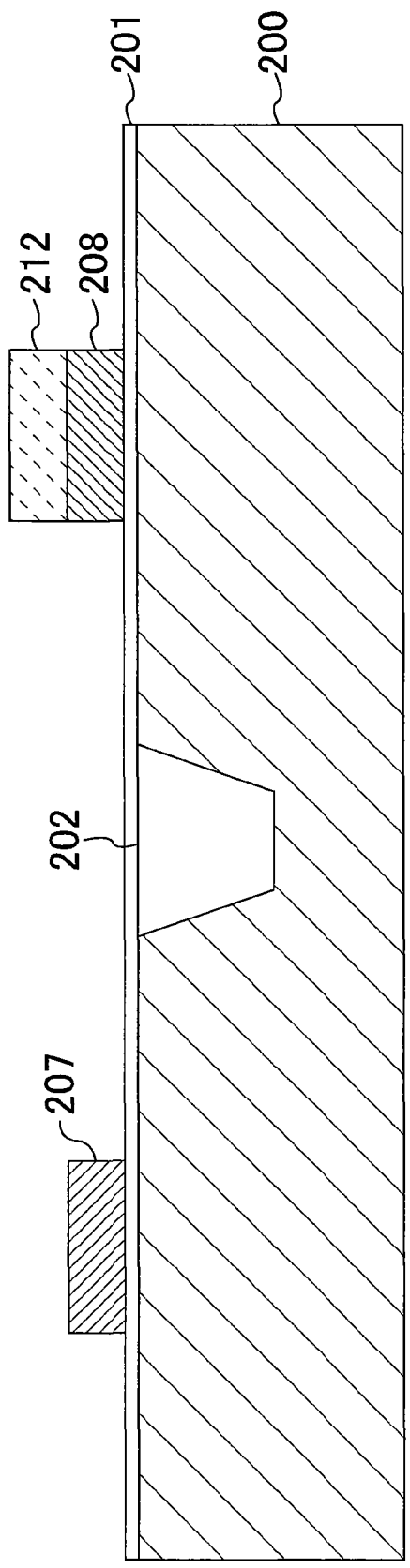

Next, as shown in FIG. 20A, a mask 212 is formed on the second gate electrode material film 208A, covering the gate electrode formation region in the Pch transistor. Here, the mask 212 is preferably made of a hard mask material, such as TEOS (tetraethylorthosilicate) or the like, instead of an organic material, such as a resist or the like, in order to avoid device contamination during subsequent steps. Next, as shown in FIG. 20B, by performing dry etching with respect to the second gate electrode material film 208A using the mask 212, the second gate electrode material film 208A is etched back and removed from a region which is not masked. Thereby, the second gate electrode 208 of the Pch transistor is formed. Thereafter, as shown in FIG. 21A, the mask 212 is removed by cleaning with, for example, a mixture of sulfuric acid and hydrogen peroxide solution.

Next, as shown in FIG. 21B, a hard mask film 213 having a thickness of 120 to 160 nm is deposited on an entire surface of the substrate 200 using, for example, a vertical batch furnace or the like at a temperature of 300 to 600° C.

Figure 22A:
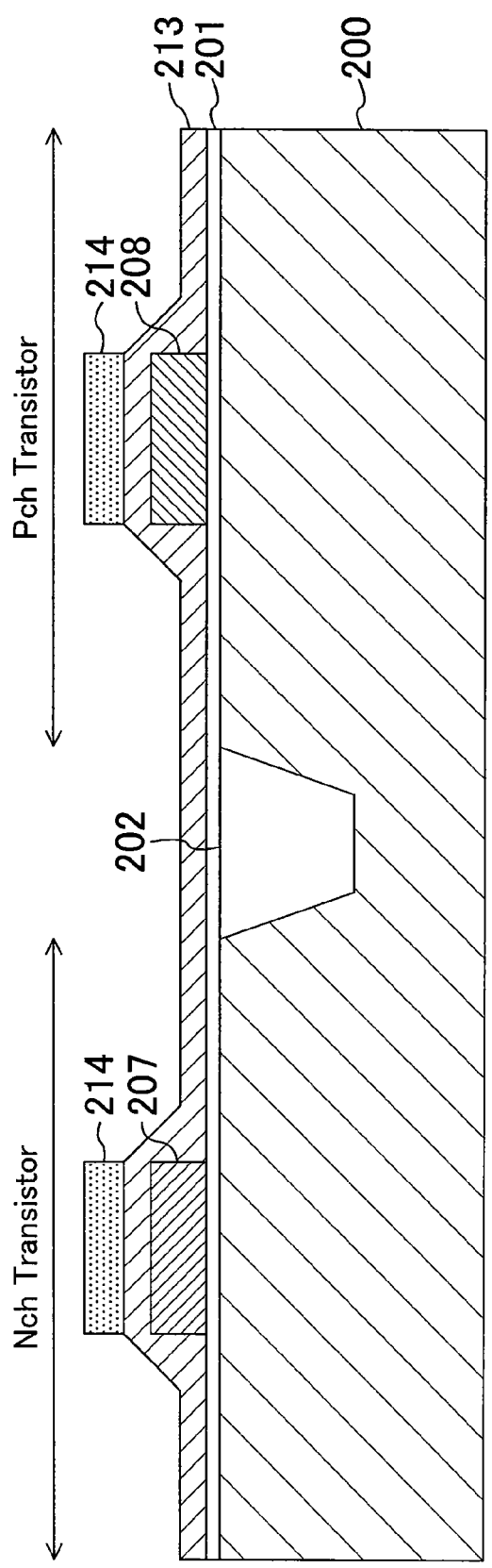
FIGS. 22A and 22B are cross-sectional views showing steps of the method for manufacturing the semiconductor device of the second embodiment of the present invention.
Figure 22B:
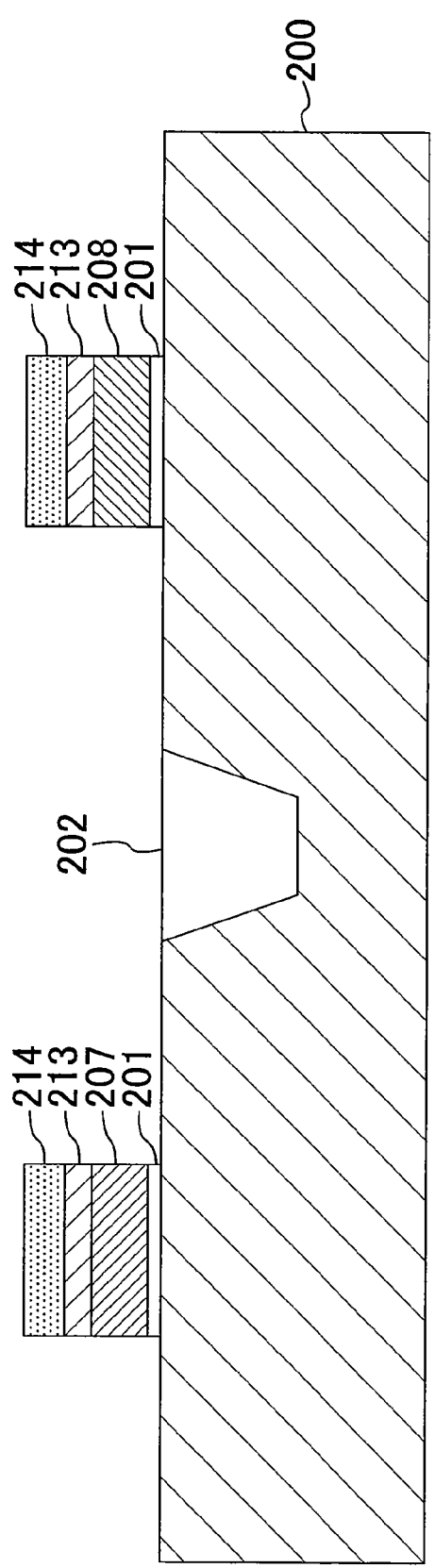

Next, as shown in FIG. 22A, a resist pattern 214 is formed on the hard mask film 213, covering the gate electrode formation region. Next, as shown in FIG. 22B, etching is performed with respect to the hard mask film 213 and the gate insulating film 201, where the resist pattern 214 is used as a mask, thereby etching back and removing the hard mask film 213 and the gate insulating film 201 from regions which are not masked. Thereafter, as shown in FIG. 23A, the resist pattern 214 is removed by cleaning with, for example, a mixture of sulfuric acid and hydrogen peroxide solution.

Figure 24A:
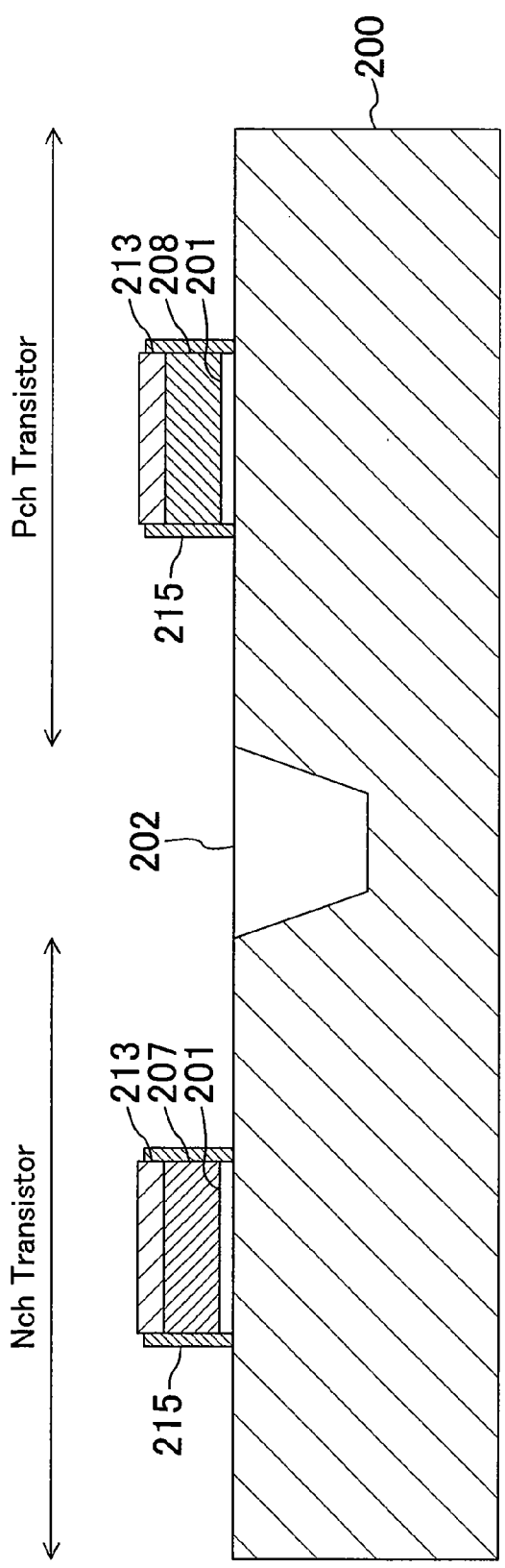
FIGS. 24A and 24B are cross-sectional views showing steps of the method for manufacturing the semiconductor device of the second embodiment of the present invention.

Next, as shown in FIG. 23B, oxidation is performed at a temperature of 800 to 1000° C. using, for example, a vertical batch furnace or the like, thereby forming a silicon oxide film 215A having a thickness of, for example, 10 to 20 nm on an entire surface of the substrate 200. Next, as shown in FIG. 24A, etch back is performed with respect to the silicon oxide film 215A so that surfaces of the hard mask film 213 on the gate electrodes 207 and 208 and surfaces other than the gate electrode formation region of the substrate 200 are exposed, and the silicon oxide film 215A (i.e., the offset spacers 215) is left on side surfaces of the gate electrodes 207 and 208.

Figure 24B:
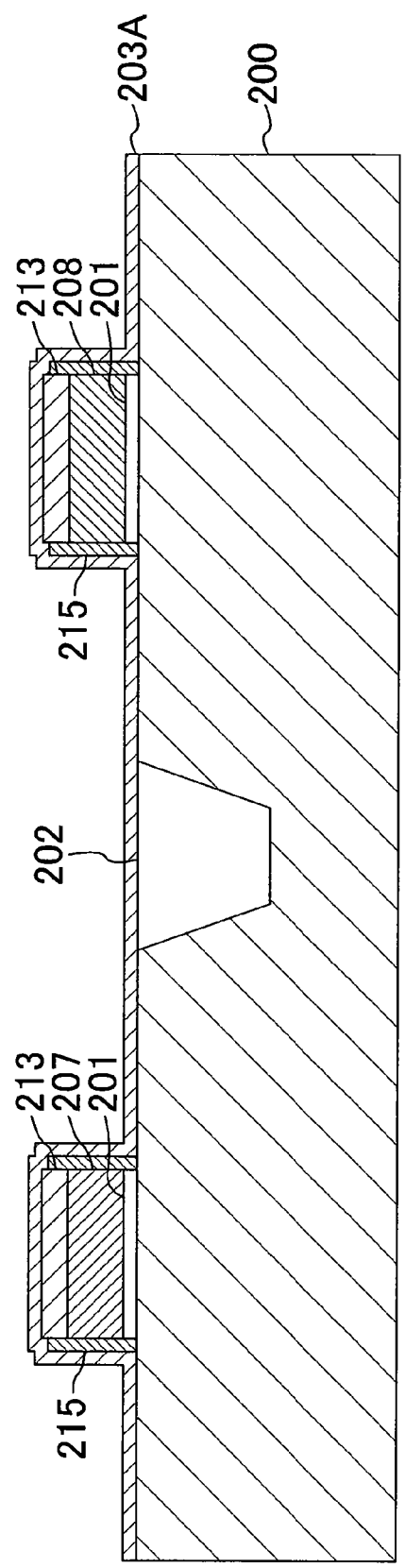
Figure 25A:
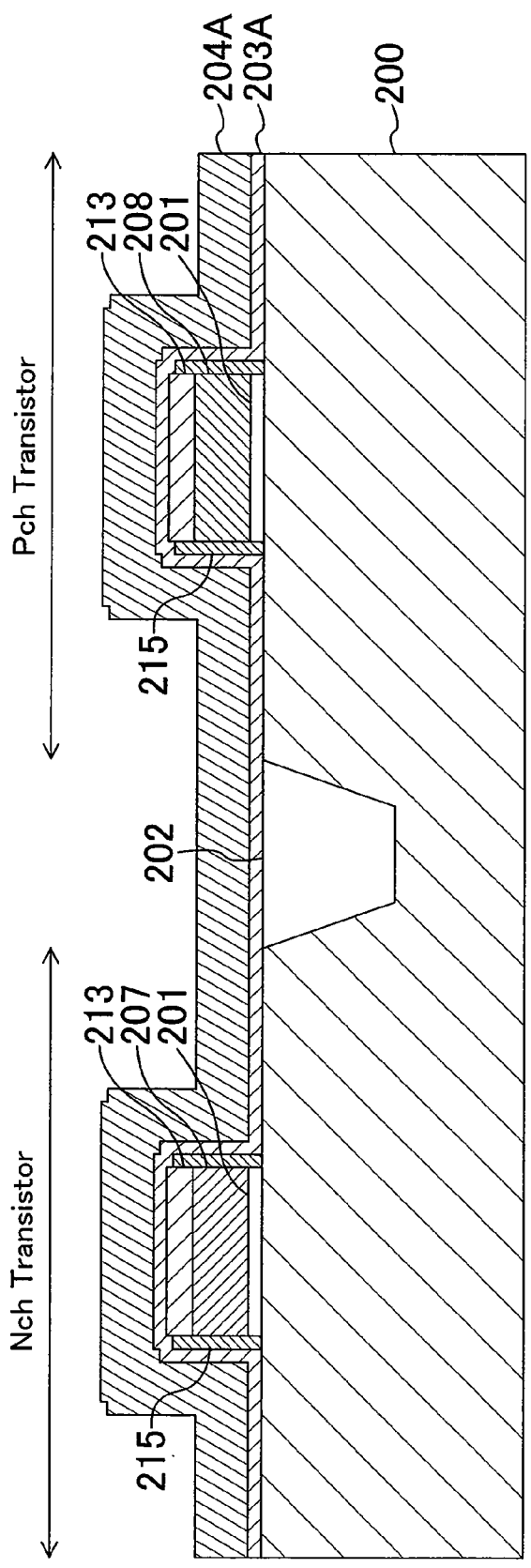
FIGS. 25A and 25B are cross-sectional views showing steps of the method for manufacturing the semiconductor device of the second embodiment of the present invention.
Figure 25B:
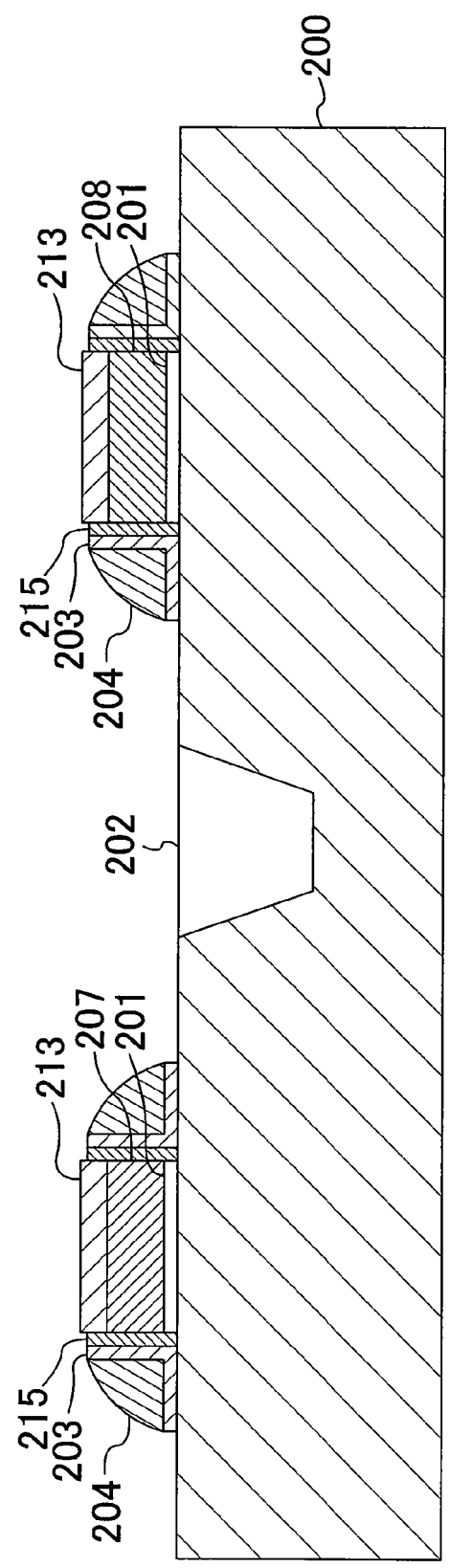

Next, as shown in FIG. 24B, a silicon oxide film 203A having a thickness of 10 to 20 nm is deposited on an entire surface of the substrate 200 at a temperature of 300 to 600° C. using, for example, a vertical batch furnace or the like. Following this, as shown in FIG. 25A, a silicon nitride film 204A having a thickness of 50 to 100 nm is deposited on an entire surface of the substrate 200 at a temperature of 500 to 1000° C. using, for example, a vertical batch furnace or the like. Next, as shown in FIG. 25B, etch back is performed with respect to the silicon nitride film 204A at a temperature of, for example, 200 to 400° C. so that the silicon nitride film 204A having a thickness of 50 to 90 nm (i.e., the outer sidewall spacers 204) is left on side surfaces of the gate electrodes 207 and 208, and a surface of the substrate 200 in an active region between the gate electrode formation regions is exposed, extending over a width of, for example, 20 to 60 nm. Also, in this case, the silicon oxide film 203A (i.e., the inner sidewall spacers 203) is interposed between the outer sidewall spacers 204 and the offset spacers 215.

Next, although it is not shown, boron implantation for Pch source/drain formation is performed with, for example, an implantation energy of 2 to 20 keV and an implantation dose $5 \times 10^{12}$ to $1 \times 10^{15}$ cm$^{-2}$, where regions other than the Pch source/drain formation regions are masked. Following this, arsenic implantation for Nch source/drain formation is performed with, for example, an implantation energy of 10 to 20 keV and an implantation dose of $1 \times 10^{14}$ to $1 \times 10^{16}$ cm$^{-2}$, and phosphorous implantation is then performed with, for example, an implantation energy of 15 to 30 keV and an implantation dose of $1 \times 10^{12}$ to $1 \times 10^{14}$ cm$^{-2}$, where regions other than the Nch source/drain formation regions are masked. Thereafter, surface portions of the thus-formed source/drain regions may be silicided.

Next, as shown in FIG. 26A, the insulating film 206 made of an SA-NSG film having a thickness of 100 to 200 nm is deposited on an entire surface of the substrate 200 at a temperature of 500 to 700° C. using, for example, a CVD device or the like. Next, as shown in FIG. 26B, etch back is performed so that the insulating film 206 is left, having a thickness of about 50 to 100 nm. Thereby, the hard mask film 213 on the gate electrodes 207 and 208 is exposed.

Figure 27:
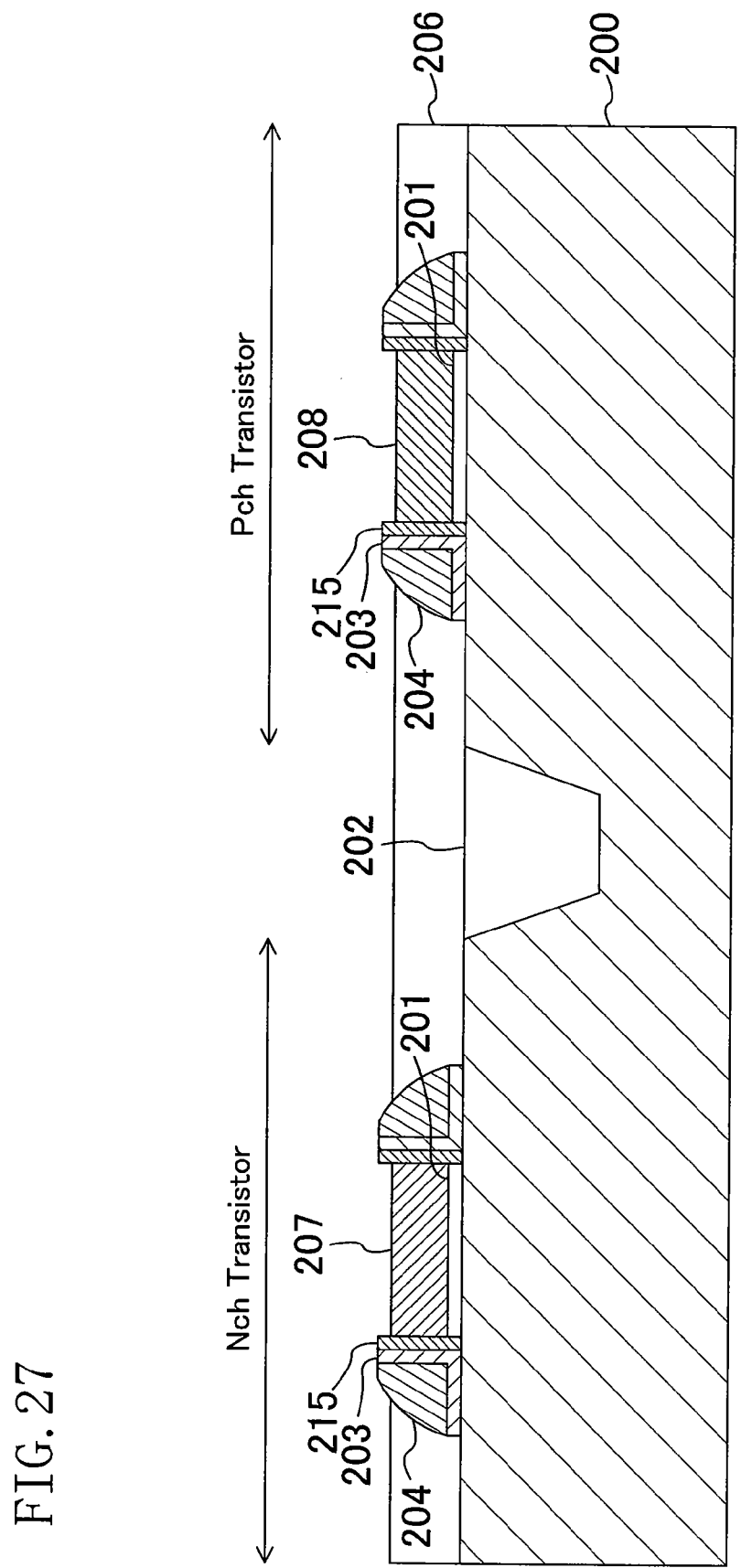
FIG. 27 is a cross-sectional view showing a step of the method for manufacturing the semiconductor device of the second embodiment of the present invention.

Next, as shown in FIG. 27, the hard mask film 213 on the gate electrodes 207 and 208 is selectively etched and removed. Thereby, surfaces of the gate electrodes 207 and 208 are exposed. In this case, upper portions of the offset spacers 215, the inner sidewall spacers 203, and the outer sidewall spacers 204 formed on the side surfaces of the gate electrodes 207 and 208 are also etched and removed.

According to the above-described method of this embodiment, a tensile stress caused by the second gate electrode material film 208A is smaller than a tensile stress caused by the first gate electrode material film 207A. In other words, by using gate electrode materials which cause stresses of desired magnitudes, depending on the type of each transistor, an appropriate stress control can be performed with respect to the channel region of each transistor without using a liner nitride film. Therefore, the performance of both the Nch transistor and the Pch transistor can be improved without the occurrence of a defect caused by a liner nitride film (e.g., a crystal defect due to a crack) or the like.

Note that, in the method of this embodiment, the material for the first gate electrode material film 207A is not particularly limited, and a material having a relatively large tensile stress, such as Zr—Ge, V—Ge, Ta—Ge, Cr—Ge, Pt—Ge, Pd—Ge, Fe—Ge or the like, can be used. Also, the material for the second gate electrode material film 208A is not particularly limited, and a material having a relatively small tensile stress, such as Ni—Ge, Co—Ge, Mo—Ge, W—Ge, Mg—Ge, Al—Ge, Au—Ge, Cu—Ge, or the like, can be used.

First Variation of Second Embodiment

Hereinafter, a semiconductor device according to a first variation of the second embodiment of the present invention and a method for manufacturing the semiconductor device will be described with reference to the drawings.

Figure 28:
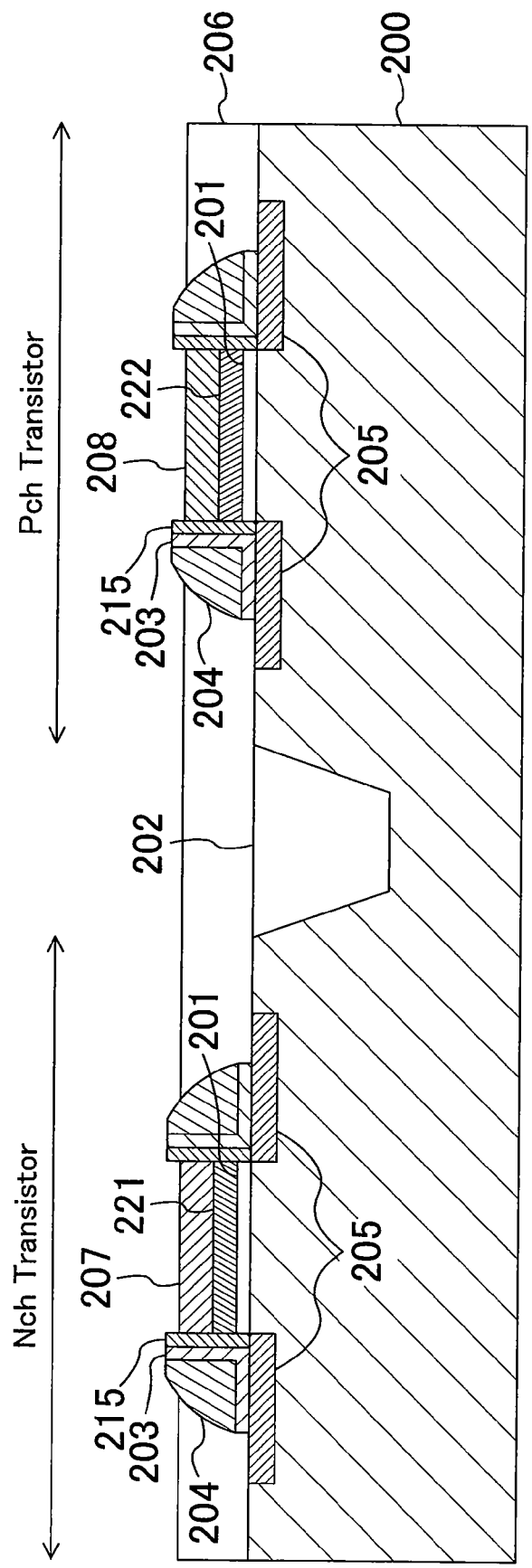
FIG. 28 is a cross-sectional view showing a structure of a gate electrode and its vicinity of a semiconductor device according to a first variation of the second embodiment of the present invention.

FIG. 28 is a cross-sectional view showing a structure of a gate electrode and its vicinity of the semiconductor device of the first variation of the second embodiment. Note that, in FIG. 28, the same parts as those of the second embodiment of FIG. 16 are indicated by the same reference numerals and will not be described.

As shown in FIG. 28, this variation is different from the second embodiment in that a conductive layer 221 made of, for example, polysilicon for a threshold control is formed between the first gate electrode 207 and the gate insulating film 201 in the Nch transistor, and a conductive layer 222 made of, for example, polysilicon for a threshold control is formed between the second gate electrode 208 and the gate insulating film 201 in the Pch transistor. Note that the conductive layers 221 and 222 each serve as a portion of the corresponding gate electrode.

According to this variation, the effect of facilitating a threshold control is obtained in addition to an effect similar to that of the second embodiment.

Second Variation of Second Embodiment

Hereinafter, a semiconductor device according to a second variation of the second embodiment of the present invention and a method for manufacturing the semiconductor device will be described with reference to the drawings.

Figure 29:
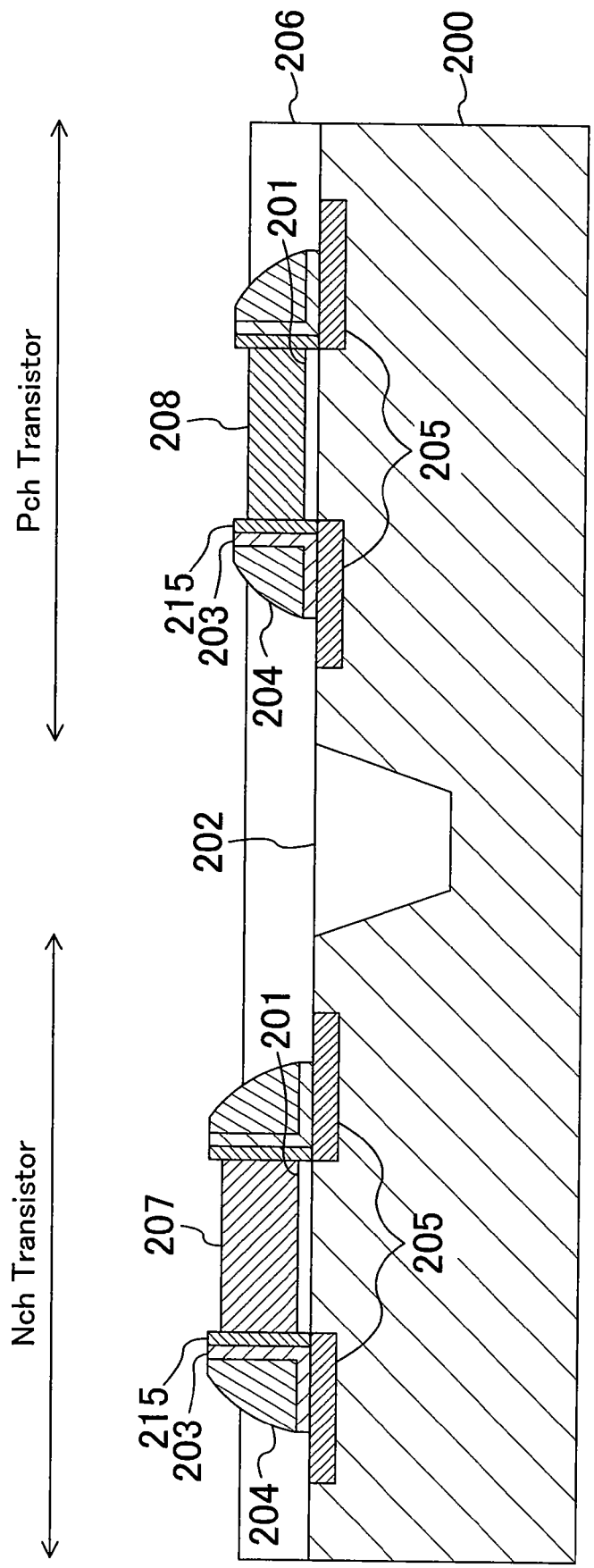
FIG. 29 is a cross-sectional view showing a structure of a gate electrode and its vicinity of a semiconductor device according to a second variation of the second embodiment of the present invention.
Figure 32:
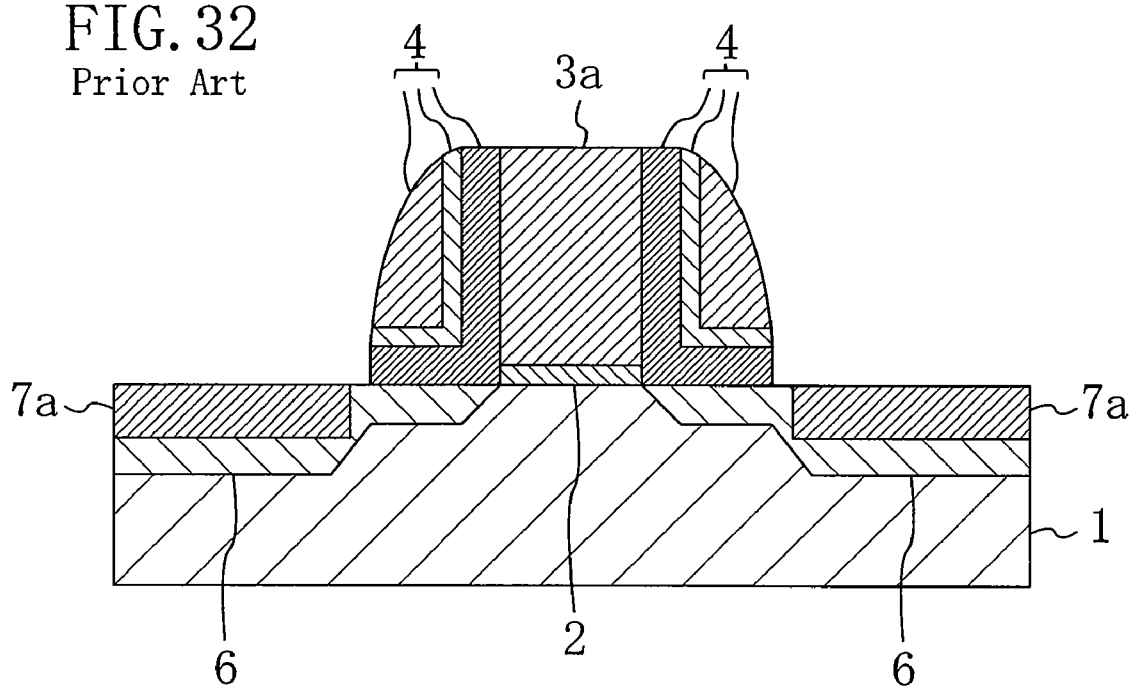
FIG. 32 is a cross-sectional view showing a structure of a gate electrode and its vicinity of a semiconductor device having a FUSI electrode structure formed using a conventional method.
Figure 33:
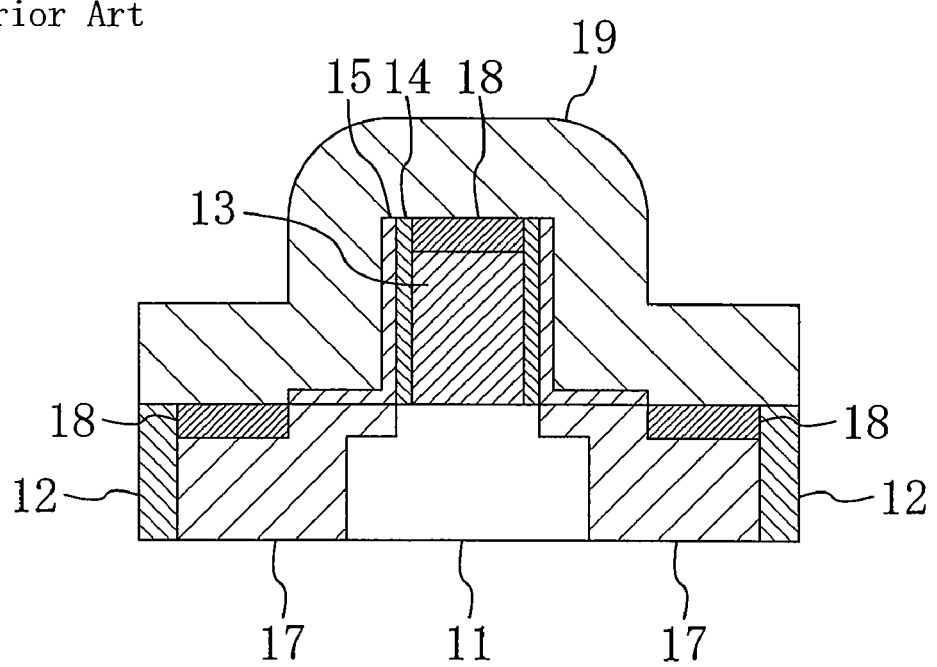
FIG. 33 is a cross-sectional view showing a structure of a gate electrode and its vicinity of a semiconductor device including a liner nitride film formed using a conventional method.

FIG. 29 is a cross-sectional view showing a structure of a gate electrode and its vicinity of the semiconductor device of the second variation of the second embodiment. Note that, in FIG. 29, the same parts as those of the second embodiment of FIG. 16 are indicated by the same reference numerals and will not be described.

As shown in FIG. 29, this variation is different from the second embodiment in that the height of the first gate electrode 207 in the Nch transistor is higher than the height of the second gate electrode 208 in the Pch transistor, and the heights of the offset spacers 215, the inner sidewall spacers 203, and the outer sidewall spacers 204 formed on the side surfaces of the first gate electrode 207 are higher than the heights of the offset spacers 215, the inner sidewall spacers 203, and the outer sidewall spacers 204 formed on the side surfaces of the second gate electrode 208, respectively.

According to this variation, in addition to an effect similar to that of the second embodiment, a stress on the channel region of the Pch transistor can be further reduced, so that the performance of the Pch transistor can be further improved.

What is claimed is:

1. A semiconductor device comprising:
an Nch transistor having a first gate electrode; and
a Pch transistor having a second gate electrode, wherein
the first gate electrode and the second gate electrode are made of materials causing tensile stresses of different magnitudes,
an insulating sidewall spacer is formed on a side surface of each of the first gate electrode and the second gate electrode, and a tensile stress caused by the material for the first gate electrode is larger than a tensile stress caused by the material for the second gate electrode.

2. The semiconductor device of claim 1, wherein the density of the material for the first gate electrode is higher than the density of the material for the second gate electrode.

3. The semiconductor device of claim 1, wherein the first gate electrode and the second gate electrode are made of silicide, and
the expansion coefficient during silicidation of a metal included in the first gate electrode is larger than the expansion coefficient during silicidation of a metal included in the second gate electrode.

4. The semiconductor device of claim 1, wherein the first gate electrode has a first alloy compound layer made of at least one of Zr—Ge, V—Ge, Ta—Si, Ta—Ge, Cr—Ge, Pt—Si, Pt—Ge, Pd—Si, Pd—Ge, Fe—Si, and Fe—Ge.

5. The semiconductor device of claim 4, wherein the first gate electrode further has a first conductive layer for a threshold control below the first alloy compound layer.

6. The semiconductor device of claim 1, wherein the second gate electrode has a second alloy compound layer made of at least one of Ni—Si, Ni—Ge, Co—Si, Co—Ge, Mo—Si, Mo—Ge, W—Si, W—Ge, Mg—Si, Mg—Ge, Al—Ge, Au—Ge, Cu—Si, and Cu—Ge.

7. The semiconductor device of claim 6, wherein the second gate electrode further has a second conductive layer for a threshold control below the second alloy compound layer.

8. The semiconductor device of claim 1, wherein the insulating sidewall spacer has a laminated structure including a silicon oxide film and a silicon nitride film.

9. The semiconductor device of claim 1, wherein the height of the insulating sidewall spacer formed on the side surface of the first gate electrode is higher than the height of the insulating sidewall spacer formed on the side surface of the second gate electrode.

10. The semiconductor device of claim 1, wherein a trench-shaped isolation region having a depth in a range between 300 nm and 400 nm both inclusive is provided between the Nch transistor and the Pch transistor.

11. The semiconductor device of claim 1, wherein the height of each of the first gate electrode and the second gate electrode is between 150 nm and 200 nm both inclusive.

12. The semiconductor device of claim 1, wherein a gate insulating film having a thickness in a range between 1 nm and 3 nm both inclusive is provided below each of the first gate electrode and the second gate electrode.

13. An Nch transistor comprising:
a gate electrode having a stress control layer made of at least one alloy compound of Zr—Ge, V—Ge, Ta—Ge, Cr—Ge, Pt—Ge, Fe—Si, and Fe—Ge.

14. A Pch transistor comprising:
a gate electrode having a stress control layer made of at least one alloy compound of Ni—Ge, Mo—Ge, W—Ge, Mg—Si, Mg—Ge, Al—Ge, Au—Ge, Cu—Si, and Cu—Ge.

15. A method for manufacturing a semiconductor device comprising the steps of
(a) forming a first gate electrode on an Nch transistor formation region in a substrate; and
(b) forming a second gate electrode on a Pch transistor formation region in the substrate, wherein
the first gate electrode and the second gate electrode are made of materials causing tensile stresses of different magnitudes,
an insulating sidewall spacer is formed on a side surface of each of the first gate electrode and the second gate electrode, and
a tensile stress caused by the material for the first gate electrode is larger than a tensile stress caused by the material for the second gate electrode.

16. The method of claim 15, further comprising, prior to the steps (a) and (b), the steps of:
(c) forming a silicon-containing film on the substrate; and
(d) performing patterning with respect to the silicon-containing film to form a first silicon-containing film pattern which is to become the first gate electrode on the Nch transistor formation region in the substrate, and a second silicon-containing film pattern which is to become the second gate electrode on the Pch transistor formation region in the substrate, wherein the step (a) includes forming a first metal film at least on the first silicon-containing film pattern before performing a first silicidation thermal treatment to form the first gate electrode,
the step (b) includes forming a second metal film at least on the second silicon-containing film pattern before performing a second silicidation thermal treatment to form the second gate electrode, and
the expansion coefficient during silicidation of a metal included in the first metal film is larger than the expansion coefficient during silicidation of a metal included in the second metal film.

17. The method of claim 16, further comprising, prior to the step (c), the steps of:
forming, on the substrate, an isolation region for separating the Nch transistor formation region and the Pch transistor formation region; and
forming a gate insulating film on the substrate.

18. The method of claim 16, further comprising the steps of:
(g1) forming a hard mask on each of the first silicon-containing film pattern and the second silicon-containing film pattern, the step (g1) being provided subsequent to the step (d) and prior to the steps (a) and (b);
(g2) removing the hard mask formed on the first silicon-containing film pattern, the step (g2) being provided between the steps (g1) and (a); and
(g3) removing the hard mask formed on the second silicon-containing film pattern, the step (g3) being provided between the steps (g1) and (b).

19. The method of claim 16, further comprising, subsequent to the step (d) and prior to the steps (a) and (b), the step of:
(j1) forming the insulating sidewall spacer on a side surface of each of the first silicon-containing film pattern and the second silicon-containing film pattern.

20. The method of claim 19, further comprising the steps of
(j2) forming an LDD region in each of the Nch transistor formation region and the Pch transistor formation region in the substrate, the step (j2) being provided subsequent to the step (d) and prior to the step (j1); and
(j3) forming source/drain regions in the Nch transistor formation region and the Pch transistor formation region in the substrate, the step (j3) being provided subsequent to the step (j1) and prior to the steps (a) and (b).

21. The method of claim 16, wherein the first silicon-containing film pattern and the second silicon-containing film pattern each have a thickness in a range between 40 nm and 60 nm both inclusive, and the first metal film and the second metal film each have a thickness in a range between 5 nm and 15 nm both inclusive.

22. The method of claim 16, wherein
in each of the first silicidation thermal treatment and the second silicidation thermal treatment, a rapid thermal process is performed in two steps at a reaction temperature in a range between 400° C. to 600° C. both inclusive.

23. The method of claim 15, wherein
the step (a) includes forming a first conductive material film at least on the Nch transistor formation region in the substrate before performing patterning with respect to the first conductive material film to form the first gate electrode,
the step (b) includes forming a second conductive material film at least on the Pch transistor formation region in the substrate before performing patterning with respect to the second conductive material film to form the second gate electrode, and
a tensile stress caused by the first conductive material film is larger than a tensile stress caused by the second conductive material film.

24. The method of claim 23, further comprising, prior to the steps (a) and (b), the steps of:
forming, on the substrate, an isolation region for separating the Nch transistor formation region and the Pch transistor formation region; and
forming a gate insulating film on the substrate.

25. The method of claim 23, further comprising, subsequent to the steps (a) and (b):
(k1) forming the insulating sidewall spacer on a side surface of each of the first gate electrode and the second gate electrode.

26. The method of claim 25, further comprising the steps of:
(k2) forming an LDD region in each of the Nch transistor formation region and the Pch transistor formation region in the substrate, the step (k2) being provided subsequent to the steps (a) and (b) and prior to the step (k1); and
(k3) forming source/drain regions in each of the Nch transistor formation region and the Pch transistor formation region in the substrate, the step (k3) being provided subsequent to the step (k1).

27. The method of claim 15, wherein
the step (a) is performed prior to the step (b).

28. A method for manufacturing a semiconductor device comprising the steps of:
(a) forming a first gate electrode on an Nch transistor formation region in a substrate;
(b) forming a second gate electrode on a Pch transistor formation region in the substrate;
(c) forming a silicon-containing film on the substrate, the step (c) being performed prior to steps (a) and (b);
(d) performing patterning with respect to the silicon-containing film to form a first silicon-containing film pattern which is to become the first gate electrode on the Nch transistor formation region in the substrate, and a second silicon-containing film pattern which is to become the second gate electrode on the Pch transistor formation region in the substrate, the step (d) being performed prior to steps (a) and (b);
(e) forming a hard mask on each of the first silicon-containing film pattern and the second silicon-containing film pattern, the step (e) being performed subsequent to the step (d) and prior to the steps (a) and (b);
(f) removing the hard mask formed on the first silicon-containing film pattern, the step (f) being performed between the steps (c) and (a); and
(g) removing the hard mask formed on the second silicon-containing film pattern, the step (g) being performed between the steps (e) and (b), wherein
the first gate electrode and the second gate electrode are made of materials causing stresses of different magnitudes,
the step (a) includes forming a first metal film at least on the first silicon-containing film pattern before performing a first silicidation thermal treatment to form the first gate electrode,
the step (b) includes forming a second metal film at least on the second silicon-containing film pattern before performing a second silicidation thermal treatment to form the second gate electrode, and
the expansion coefficient during silicidation of a metal included in the first metal film is larger than the expansion coefficient during silicidation of a metal included in the second metal film.

* * * * *